(12) United States Patent
Ito et al.

(10) Patent No.: US 9,021,347 B2
(45) Date of Patent: Apr. 28, 2015

(54) INFORMATION PROCESSING METHOD AND APPARATUS, PROGRAM, AND STORAGE MEDIUM

(75) Inventors: Yoshinori Ito, Tokyo (JP); Kan Torii, Tokyo (JP); Takahisa Yamamoto, Kawasaki (JP); Masami Kato, Sagamihara (JP)

(73) Assignee: Canon Kabushiki Kaisha, Tokyo (JP)

(*) Notice: Subject to any disclaimer, the term of this patent is extended or adjusted under 35 U.S.C. 154(b) by 1364 days.

(21) Appl. No.: 12/602,091

(22) PCT Filed: May 27, 2008

(86) PCT No.: PCT/JP2008/060106
§ 371 (c)(1),
(2), (4) Date: Nov. 25, 2009

(87) PCT Pub. No.: WO2008/146934
PCT Pub. Date: Dec. 4, 2008

(65) Prior Publication Data
US 2010/0180189 A1    Jul. 15, 2010

(30) Foreign Application Priority Data

May 31, 2007    (JP) .................... 2007-145448

(51) Int. Cl.
*G06F 17/00*    (2006.01)
*G06T 1/60*    (2006.01)
(Continued)

(52) U.S. Cl.
CPC .............. *G06T 1/60* (2013.01); *G06K 9/00248* (2013.01); *G06K 9/00986* (2013.01); *G06K 9/4614* (2013.01); *G06K 9/6257* (2013.01); *G06T 7/0081* (2013.01); *G06T 7/0087* (2013.01);
(Continued)

(58) Field of Classification Search
USPC .......... 345/423, 582, 586, 587, 643; 382/108, 382/118, 192, 205
See application file for complete search history.

(56) References Cited

U.S. PATENT DOCUMENTS 5,038,209 A *   8/1991   Hang ..................... 375/240.05
5,508,823 A     4/1996   Kiyohara et al.
(Continued)

FOREIGN PATENT DOCUMENTS

JP    9-261463 A    10/1997
JP    10-056565 A    2/1998
(Continued)

OTHER PUBLICATIONS

Darwyn Peachey, "Solid Texturing of Complex Surfaces", publisher ACM, published: 1985, pp. 279,286.*
(Continued)

*Primary Examiner* — Wilson Tsui
(74) *Attorney, Agent, or Firm* — Fitzpatrick, Cella, Harper & Scinto

(57) ABSTRACT

An information processing method comprises the steps of: inputting an input information of a multi-dimensional array; calculating an accumulated information value corresponding to a position of each element of the input information; and holding the accumulated information value in a buffer having a size of predetermined bits, wherein in the holding step, when an accumulated information value calculated in the calculating step overflows with respect to the size, a part not more than the predetermined bits of the calculated accumulated information value is held as the accumulated information value.

19 Claims, 18 Drawing Sheets

(51) Int. Cl.
- *G06K 9/00* (2006.01)
- *G06K 9/46* (2006.01)
- *G06K 9/62* (2006.01)
- *G06T 7/00* (2006.01)
- *H03M 7/30* (2006.01)
- *G06F 17/22* (2006.01)

(52) U.S. Cl.
CPC ........... *G06T2207/20021* (2013.01); *G06T 2207/30201* (2013.01); *H03M 7/3059* (2013.01)

(56) References Cited

U.S. PATENT DOCUMENTS

| | | | |
|---|---|---|---|
| 5,631,644 A * | 5/1997 | Katata et al. | 341/67 |
| 5,668,599 A * | 9/1997 | Cheney et al. | 375/240.15 |
| 6,452,603 B1 * | 9/2002 | Dignam | 345/582 |
| 6,778,181 B1 * | 8/2004 | Kilgariff et al. | 345/582 |
| 7,369,687 B2 | 5/2008 | Kawato et al. | |
| 7,379,568 B2 | 5/2008 | Movellan et al. | |
| 7,508,961 B2 * | 3/2009 | Chen et al. | 382/118 |
| 2006/0228005 A1 | 10/2006 | Matsugu et al. | |
| 2008/0106569 A1 | 5/2008 | Suwa et al. | |
| 2009/0157707 A1 | 6/2009 | Ito et al. | |
| 2009/0324060 A1 | 12/2009 | Sato et al. | |

FOREIGN PATENT DOCUMENTS

| | | |
|---|---|---|
| JP | 2004-185611 A | 7/2004 |
| JP | 2005-044330 A | 2/2005 |
| JP | 2005-293061 A | 10/2005 |

OTHER PUBLICATIONS

F.C. Crow, "Summed-Area Tables for Texture Mapping", Computer Graphics, vol. 18, No. 3, Jul. 1984, pp. 207 to 212.

P. Viola, et al., "Rapid Object detection using a Boosted Cascade of Simple Features", Proc. IEEE Conf. On Computer Vision and Pattern Recognition, 2001, pp. 1 to 9.

"7.2 Fortran 90", http://www.mcs.anl.gov/-itf/dbpp/text/node8.4.html, XP-002723736, pp. 1-4 (Apr. 29, 1998).

European Search Report dated May 13, 2014 in European Application No. 08753124.0 (PCT/JP2008060106).

* cited by examiner

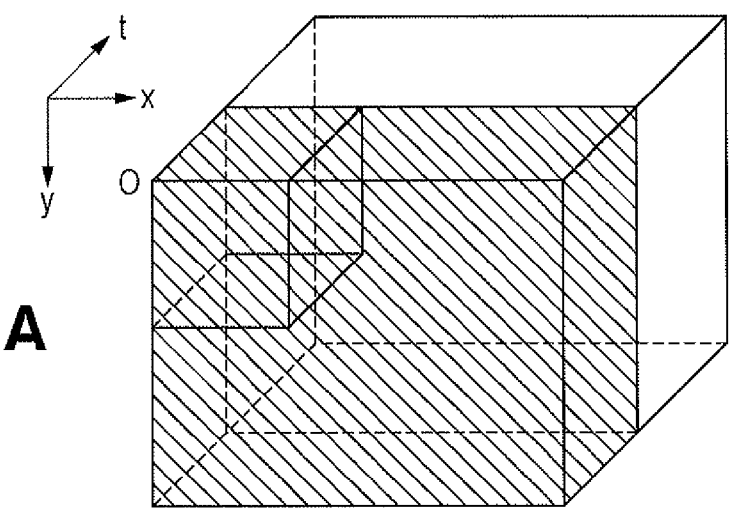
F I G. 20A
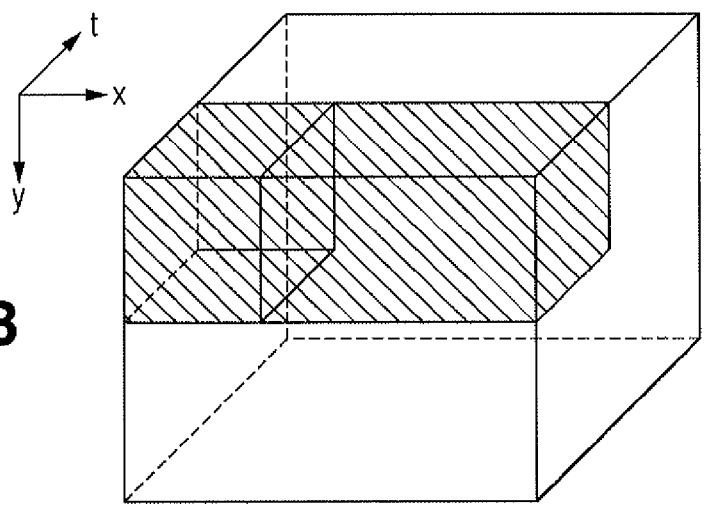
F I G. 20B
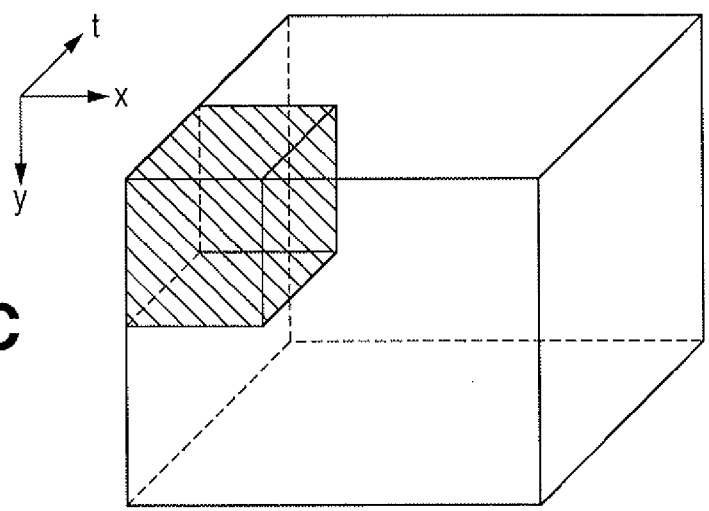
F I G. 20C

INFORMATION PROCESSING METHOD AND APPARATUS, PROGRAM, AND STORAGE MEDIUM

TECHNICAL FIELD

The present invention relates to an information processing method and apparatus for image processing, image recognition and image composition, information analysis, and the like.

BACKGROUND ART

In the information processing field, multi-dimensional array information is frequently handled. Partial processing, statistical processing, and the like associated with image processing, image recognition and image composition, and the like often calculate and use the sum total value of elements within a range of a specific region.

For this purpose, a spreadsheet application such as Microsoft Excel® or the like as an example of an application which implements information processing has a function of calculating a sum of elements within a designated rectangle in a two-dimensional table. A programming language for calculations such as MathWorks MATLAB® includes a function of calculating the sum of elements of a matrix.

In the field of computer graphics, F. C. Crow has proposed the concept called "summed-area table" of accumulated image information for original input image information (F. C. Crow, "Summed-Area Tables For Texture Mapping", Computer Graphics, 1984., "Crow84" hereinafter). In this reference, assuming that a summed-area table is a two-dimensional array having the same size (the same number of elements) as an input image, and letting I(x, y) be a pixel value at a coordinate position (x, y) of the input image, a component C(x, y) at the same position (x, y) of the summed-area table is defined as:

$$C(x, y) = \sum_{\substack{x' \leq x \\ y' \leq y}} I(x', y') \quad (1)$$

That is, as shown in FIG. 4, the sum total value of pixels in a rectangle defined by an origin point position (0, 0) and a position (x, y) as diagonal positions on an original input image 4a is a value C(x, y) at the position (x, y) of a summed-area table 4b. (Note that an original summed-area table of Crow84 has the lower left corner of an image as an origin point position, but the upper left corner is used as an origin point to interface with the following description.)

According to this definition, the sum of pixel values I(x, y) in an arbitrary region horizontally or vertically allocated on an input image can be calculated with reference to only the values of four points on the summed-area table using the following equation. For example, as shown in FIG. 5, a sum total $C(x_0, y_0; x_1, y_1)$ of pixel values in a rectangular region defined by $(x_0, y_0)$ and $(x_1, y_1)$ as diagonal points can be calculated by:

$$C(x_0,y_0;x_1,y_1)=C(x_0-1,y_0-1)-C(x_0-1,y_1)-C(x_1,y_0-1)+C(x_1,y_1) \quad (2)$$

In this way, the sum total of values in an arbitrary rectangular region on an image can be calculated at high speed.

On the other hand, in the field of image recognition, accumulated image information equivalent to the summed-area table is called "Integral image". Also, a face detection apparatus that cascade-connects weak classifiers each including a plurality of rectangular filters has been proposed (for example, P. Viola, M. Jones, "Rapid Object Detection using a Boosted Cascade of Simple Features", Proc. IEEE Conf. on Computer Vision and Pattern Recognition, Vol. 1, pp. 511-518, December 2001., "Viola01" hereinafter).

Furthermore, based on the idea of Viola01, face extraction from successive frames in real time (for example, see Japanese Patent Laid-Open No. 2004-185611), facial expression recognition (for example, see Japanese Patent Laid-Open No. 2005-44330), and instruction input by means of gestures of a face (for example, see Japanese Patent Laid-Open No. 2005-293061), and the like have been proposed.

A pattern recognition method described in Viola01, which can be applied as subsequent processing in an embodiment of the present invention (to be described later), will be described in detail below.

In Viola01, as shown in FIG. 8, a rectangular region 801 (to be referred to as "processing window" hereinafter) having a specific size is moved in an image 800 to be processed, and it is determined if the processing window 801 at each moving destination includes a human face.

FIG. 9 shows the sequence of face detection processing executed in Viola01 in the processing window 801 at each moving destination. The face detection processing in a certain processing window is executed in a plurality of stages. Different combinations of weak classifiers are assigned to the respective stages. Each weak classifier detects a so-called Haar-like feature, and comprises a combination of rectangular filters.

As shown in FIG. 9, the different numbers of weak classifiers are assigned to the respective stages. Each stage determines, using a weak classifier or classifiers of a pattern or patterns assigned to itself, if the processing window includes a human face.

An order of execution of the determination processing is assigned to the respective stages, which execute processes in cascade according to that order. That is, in, for example, FIG. 9, the determination processing is executed in the order of the first stage, second stage, and third stage.

If it is determined in a given stage that the processing window at a certain position does not include any human face, the processing is aborted for the processing window at that position to skip the determination processing in the subsequent stages. If it is determined in the final stage that the processing window includes a human face, it is determined that the processing window at that position includes a human face.

FIG. 10 is a flowchart showing the sequence of the face detection processing. A practical sequence of the face detection processing will be described below with reference to FIG. 10.

In the face detection processing, the processing window 801 to be processed is allocated at an initial position on a face detection target image 800 (step S1001). Basically, this processing window 801 is moved from the end of the face detection target image 800 at predetermined intervals in turn in the vertical and horizontal directions. With this movement, the entire image is comprehensively selected. For example, by raster-scanning the face detection target image 800, the processing window 801 is selected.

The determination processing as to whether or not the selected processing window 801 includes a human face is executed. This determination processing is executed in a plurality of stages, as described above using FIG. 9. For this reason, a stage that executes the determination processing is selected in turn from the first stage (step S1002).

The selected stage executes the determination processing (step S1003). In the determination processing of this stage, an accumulated score (to be described later) is calculated, and it is determined if the calculated accumulated score exceeds a threshold set in advance for each stage (step S1004). If the accumulated score does not exceed the threshold (No in step S1004), it is determined that the processing window does not include any human face (step S1008), and the processes in step S1007 and subsequent steps are executed. The processes in step S1007 and subsequent steps will be described later.

On the other hand, if the accumulated score (to be described later) exceeds the threshold (Yes in step S1004), it is determined if that determination processing (step S1003) is executed by the final stage (step S1005). If that determination processing is executed not by the final stage (No in step S1005), the process returns to step S1002 to select the next stage, and to execute the determination processing by the newly selected stage. On the other hand, if the determination processing is executed by the final stage (Yes in step S1005), it is finally determined that the current processing window includes a human face (step S1006). At this time, it is determined that this processing window includes a human face.

It is then determined if the processing window that has undergone the determination processing is that at the last position in the face detection target image (step S1007). If the processing window is not that at the last position (No in step S1007), the process returns to step S1001 to move the processing window to the next position and to execute the processes in step S1002 and subsequent steps. If the processing window is that at the last position, the face detection processing for this input image which is to undergo face detection.

The contents of the determination processing in each stage will be described below. One or more patterns of weak classifiers are assigned to each stage. This assignment is executed by a boosting learning algorithm such as AdaBoost or the like in learning processing. Each stage determines based on the weak classifier patterns assigned to itself if the processing window includes a face.

In each stage, feature amounts in a plurality of rectangular regions in the processing window are calculated based on the weak classifier patterns assigned to that stage. The feature amount used in this case is a value calculated using the sum total of pixel values in each rectangular region such as the total, average, and the like of the pixel values in the rectangular region. The sum total value in the rectangular region can be calculated at high speed using the accumulated image information (Summed-area table or Integral Image) for an input image, as has been described using FIG. 5 in association with Crow84.

As a relative value of the calculated feature amounts (for example, a ratio or difference; a difference used in this case), the difference is calculated, and it is determined based on this difference if the processing window includes a human face. More specifically, whether or not the calculated difference is larger or smaller than a threshold set in the weak classifier pattern used in determination. According to this determination result, whether or not the processing window includes a human face is determined.

However, the determination result at this time is obtained based on each weak classifier pattern, but it is not the result of the stage. In this manner, in each stage, the determination processes are individually executed based on all the assigned weak classifier patterns, and the respective determination results are obtained.

Next, an accumulated score in that stage is calculated. Individual scores are assigned to the weak classifier patterns. If it is determined that the processing window includes a human face, a score assigned to the weak classifier pattern used at that time is referred to, and is added to the accumulated score of that stage. In this way, the sum total of scores is calculated as the accumulated score of that stage. If the accumulated score in this stage exceeds a specific threshold (accumulated score threshold), it is determined in this stage that the processing window is likely to include a human face, and the process advances to the next stage. On the other hand, if the accumulated score in this stage does not exceed the accumulated score threshold, it is determined in this stage that the processing window does not include any human face, and the cascade processing is aborted.

In Viola01, high-speed pattern identification represented by face detection is implemented in such sequence. Note that a detector in FIGS. 9 and 10 can be used as a pattern identifier for identifying objects other than faces if it has undergone appropriate learning in advance.

Upon generating the aforementioned accumulated image information (summed-area table or integral image) from input image information, the bit precision and size (that of a temporarily holding area) of a storage buffer are normally determined based on a worst value that may be calculated. That is, let $X_{img}$ be the width (the number of pixels in the horizontal direction) of input image information, and $Y_{img}$ be the height (the number of pixels in the vertical direction). Also, the bit precision of each pixel is expressed by $N_{img}$ bits (N is a positive integer). Then, the worst value $C_{max}$ is a sum total value of all pixels:

$$C_{max} = \sum_{\substack{0 \le x < X_{img} \\ 0 \le y < Y_{Hmg}}} I(x, y) = I_{max} X_{img} Y_{img} \quad (3)$$

when all pixel values assume a maximum value:

$$I_{max} = (2^{N_{img}} - 1)$$

Therefore, a bit precision $N_{buf}$ per element of the buffer that stores the accumulated image information needs to be a bit precision $N_{buf\_max}$ that can store $C_{max}$ and assumes a value considerably larger than $N_{img}$ although it depends on the image size. For example, when an 8-bit Grayscale image of a VGA size is an input image, $N_{img}$=8, $X_{img}$=640, and $Y_{img}$=480. Therefore, a buffer having $C_{max}$=78336000=4AB5000h, in other words, $N_{buf}$=$N_{buf\_max}$=27-bit precision (size) needs to be assured. When pieces of accumulated image information for the entire region of input image information must be simultaneously held, a memory area such as a RAM or the like as many as $N_{buf\_max} \times X_{img} \times Y_{img}$=8294400 bits must be assured, and the processing resources are encumbered.

Hence, the bit precision $N_{buf}$ of the buffer needs to be reduced by an arbitrary method. Especially, the reduction of $N_{buf}$ is a deep problem since the work memory size leads directly to the circuit scale upon hardware implementation of the processing based on such accumulated information. Even upon software implementation of that processing, if $N_{buf}$ can be reduced, a smaller size can be used, thus suppressing the resource consumption amount.

Crow84 describes one method of reducing the bit precision $N_{buf}$ of the buffer. That is, input information is divided into blocks each defined by 16 pixels×16 pixels, and a Summed-area table is independently calculated for each block. If the input information has the bit precision $N_{img}$=8 bits, the required bit precision of a buffer at that time is 16 bits. In addition, a 32-bit value of an original Summed-area table corresponding to a pixel position that neighbors in the upper left oblique direction toward the upper left corner is held for each block. In order to recover a value corresponding to a desired position, the 32-bit value held by the block including that position can be added to the 16-bit value of that position. (However, such calculations do not suffice to recover the original Summed-area table value in practice.)

However, in the conventional method, the sum total value of a desired region can be calculated by simple additions and subtractions like equation (2) with reference to four points, while a calculation for recovering the value of each point is added, resulting in a considerably heavier calculation load. Upon hardware implementation of the processing, the circuit scale for calculations is increased. Even upon software implementation of the processing, the processing speed lowers.

DISCLOSURE OF INVENTION

The present invention has been made to solve such problems, and has as its object to greatly reduce the buffer capacity required to hold accumulated information without increasing the circuit scale or processing load for calculations or while reducing them instead.

According to one aspect of the present invention, an information processing method comprises the steps of: inputting an input information of a multi-dimensional array; calculating an accumulated information value corresponding to a position of each element of the input information; and holding the accumulated information value in a buffer having a size of predetermined bits, wherein in the holding step, when an accumulated information value calculated in the calculating step overflows with respect to the size, a part not more than the predetermined bits of the calculated accumulated information value is held as the accumulated information value.

According to another aspect of the present invention, an information processing apparatus comprises: an input unit adapted to input an input information of a multi-dimensional array; a calculation unit adapted to calculate an accumulated information value corresponding to a position of each element of the input information; and a holding unit adapted to hold the accumulated information value in a buffer having a size of predetermined bits, wherein when an accumulated information value calculated by the calculation unit overflows the predetermined bits, the holding unit holds a part not more than the predetermined bits of the calculated accumulated information value as the accumulated information value.

Further features of the present invention will become apparent from the following description of exemplary embodiments with reference to the attached drawings.

BRIEF DESCRIPTION OF DRAWINGS

FIGS. 20A, 20B, and 20C are views showing the forms of buffers required to hold the three-dimensional accumulated information.

BEST MODE FOR CARRYING OUT THE INVENTION

Embodiments according to the present invention will be described in detail hereinafter with reference to the accompanying drawings.

In this embodiment, array information of multi-dimensions (two or more dimensions) such as the aforementioned Summed-area table or Integral Image generated by accumulated addition calculations based on input information of an array having the same number of dimensions will be simply referred to as accumulated information. Especially, when input information is image information of a two-dimensional array, that array information will be referred to as accumulated image information. In this embodiment, each element of input information is expressed as a positive integer (or a fixed-point number).

First Embodiment

Figure 1:
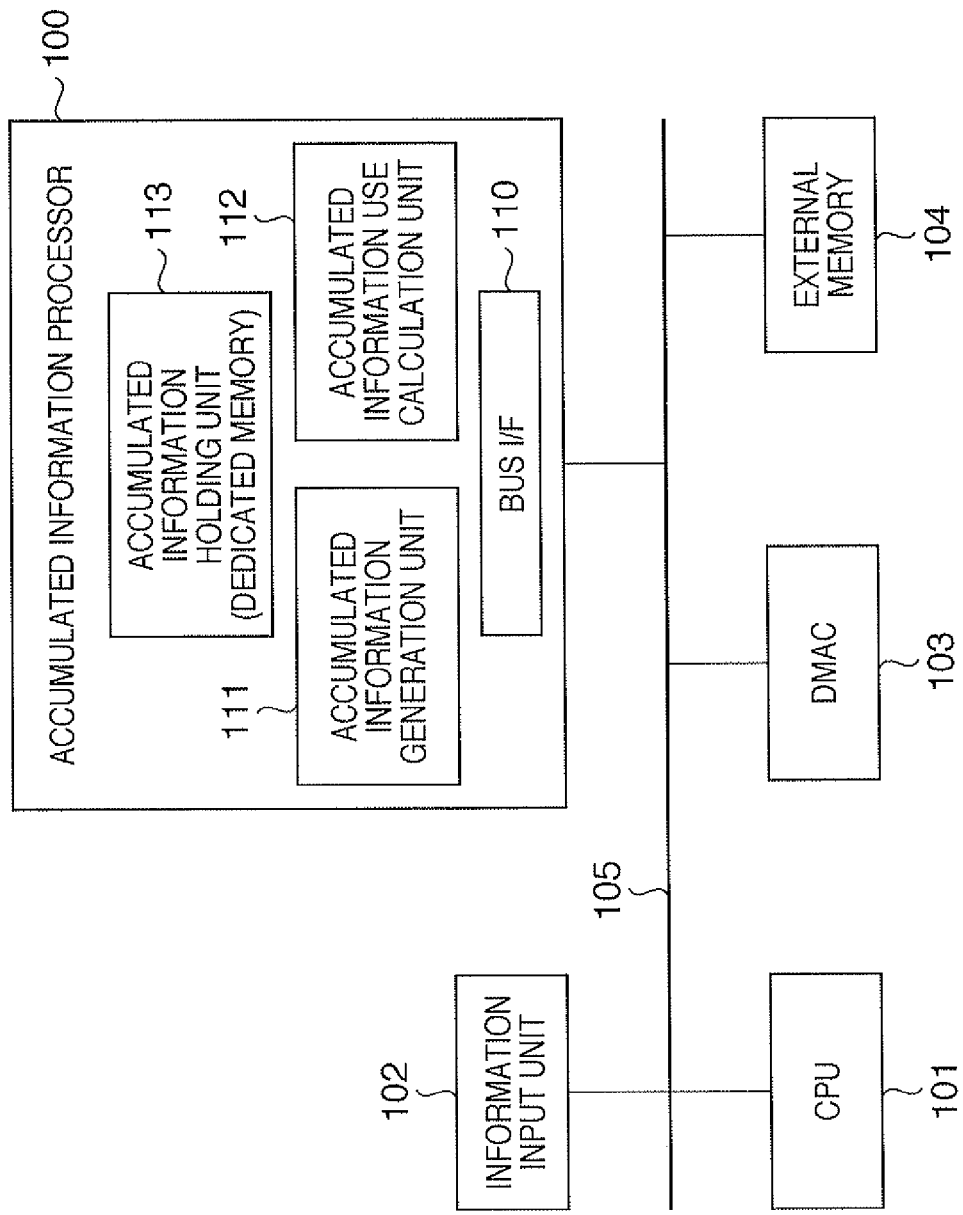
FIG. 1 is a block diagram showing the arrangement of an information processing apparatus according to the first embodiment.

FIG. 1 is a block diagram showing the arrangement of an information processing apparatus according to one embodiment of the present invention.

A CPU 101 controls respective units connected via a bus 105, and implements intended processing of the information processing apparatus. An information input unit 102 inputs input information of multi-dimensions, and fetches, for example, input image data to be processed into the apparatus. The information input unit 102 may comprise an image sensor such as a CCD or the like, or an I/F device which receives data to be processed from an external apparatus via a predetermined communication path such as a network or the like. An external memory 104 is connected to the bus 105, and comprises a storage device such as a ROM, RAM, HDD, or the like. The external memory 104 stores program codes required for the CPU 101 to operate, and is used as a work area upon execution of various kinds of processing. The external memory 104 is also used as an area for holding input information as needed.

A DMA controller (DMAC) 103 receives an operation instruction set by the CPU 101, and can autonomously and continuously execute data transfer of a predetermined size among the information input unit 102, the external memory 104, and an accumulated information processor 100 (to be described later). Upon completion of the instructed transfer operation, the DMAC 103 sends an interrupt signal to the CPU 101 via the bus 105.

The accumulated information processor 100 comprises a bus I/F 110 used to connect the bus 105, an accumulated information generation unit 111, accumulated information use calculation unit 112, and accumulated information holding unit 113. The accumulated information holding unit 113 comprises a dedicated memory of a bit precision $N_{buf}$ used to hold accumulated information, and a memory controller for controlling input and output accesses to the dedicated buffer memory. The bit precision $N_{buf}$ will be described later.

The accumulated information generation unit 111 generates accumulated information of information to be processed such as image data or the like input by the information input unit 102, and stores the generated accumulated information in the accumulated information holding unit 113. The accumulated information use calculation unit 112 executes calculation processing using the accumulated information held in the accumulated information holding unit 113 in response to a request from the CPU 101, and returns the result to the CPU 101. Note that the accumulated information is accumulated image information corresponding to the Summed-area table or Integral image of Crow84 or Viola01 when input information is two-dimensional image data. Similar accumulated information can be generated based on input information having multi-dimensions (e.g., three dimensions or more) (to be described later).

(Sequence of Processing Including Subsequent Processing)

Figure 11:
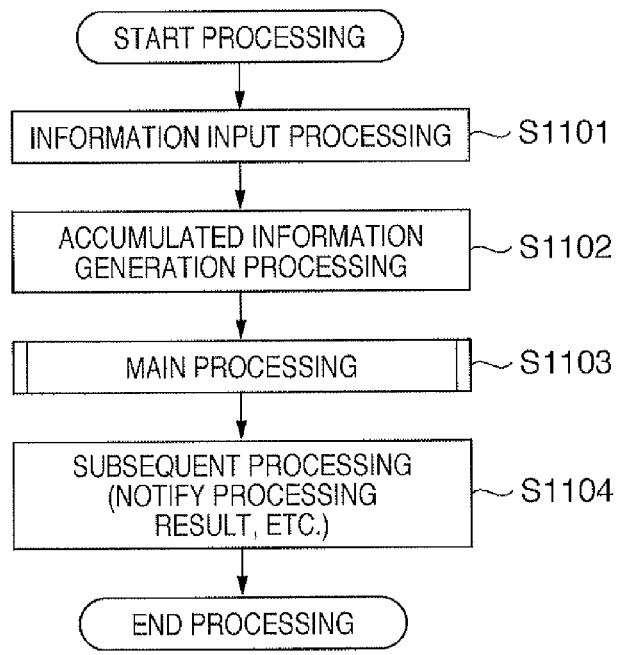
FIG. 11 is a flowchart showing the sequence of the overall processing of the first embodiment.

The sequence of the overall processing including subsequent processing in the information processing apparatus shown in FIG. 1 will be described below. FIG. 11 is a flowchart showing the sequence of the overall processing.

The information processing apparatus of this embodiment executes information input processing step S1101 first in response to a user's operation or a processing start trigger from an external apparatus (not shown). In this processing, the information input unit 102 receives input information, and stores the received information in the external memory 104 as needed. A description of this embodiment will be given under the assumption that the input information is image data expressed as a two-dimensional array of a predetermined size. However, according to the gist of the present invention, multi-dimensional array information of three or more dimensions may be input information.

In step S1102, the information processing apparatus executes accumulated information generation processing using the input information stored in the external memory 104. As will be described later, this processing generates accumulated information based on the input information in the accumulated information holding unit 113. The CPU 101 sets the DMAC 103 to sequentially transfer input information element values from the external memory 104 to the accumulated information processor 100.

When the input information is not used intact in the subsequent processing or the like of this apparatus, the processes in steps S1101 and S1102 may be parallelly executed. More specifically, every time data for one line is input, steps S1101 and S1102 may be repeated, or every time one element value is input, they may be successively processed in a pipeline manner. At this time, the CPU 101 may set the DMAC 103 to sequentially and automatically transfer respective elements of the input information from the information input unit 102 to the accumulated information processor 100.

After the accumulated information is generated in the accumulated information holding unit 113, the information processing apparatus executes main processing in step S1103. The information processing apparatus of this embodiment executes pattern identification processing described using FIG. 10 as the main processing. Of course, other kinds of processing using accumulated information can be applied. In the pattern identification processing in FIG. 10, the sum total value of elements in each rectangular region must be obtained so as to detect predetermined Haar-like features by respective weak classifier in the determination processing in step S1003, as described above. The CPU 101 can obtain this sum total value at high speed by operating the accumulated information use calculation unit 112. The operation of the accumulated information use calculation unit 112 will be described in detail later. Note that the subsequent processing described in the present specification indicates that after the main processing in step S1103.

Upon completion of the main processing in step S1103 such as the pattern identification processing, the information processing apparatus executes step S1104 as desired subsequent processing. The subsequent processing includes that for notifying the external apparatus, user, and the like of the processing result, or various kinds of processing to be executed using the recognition result.

(Description of Accumulated Information Generation Unit)

Figure 2:
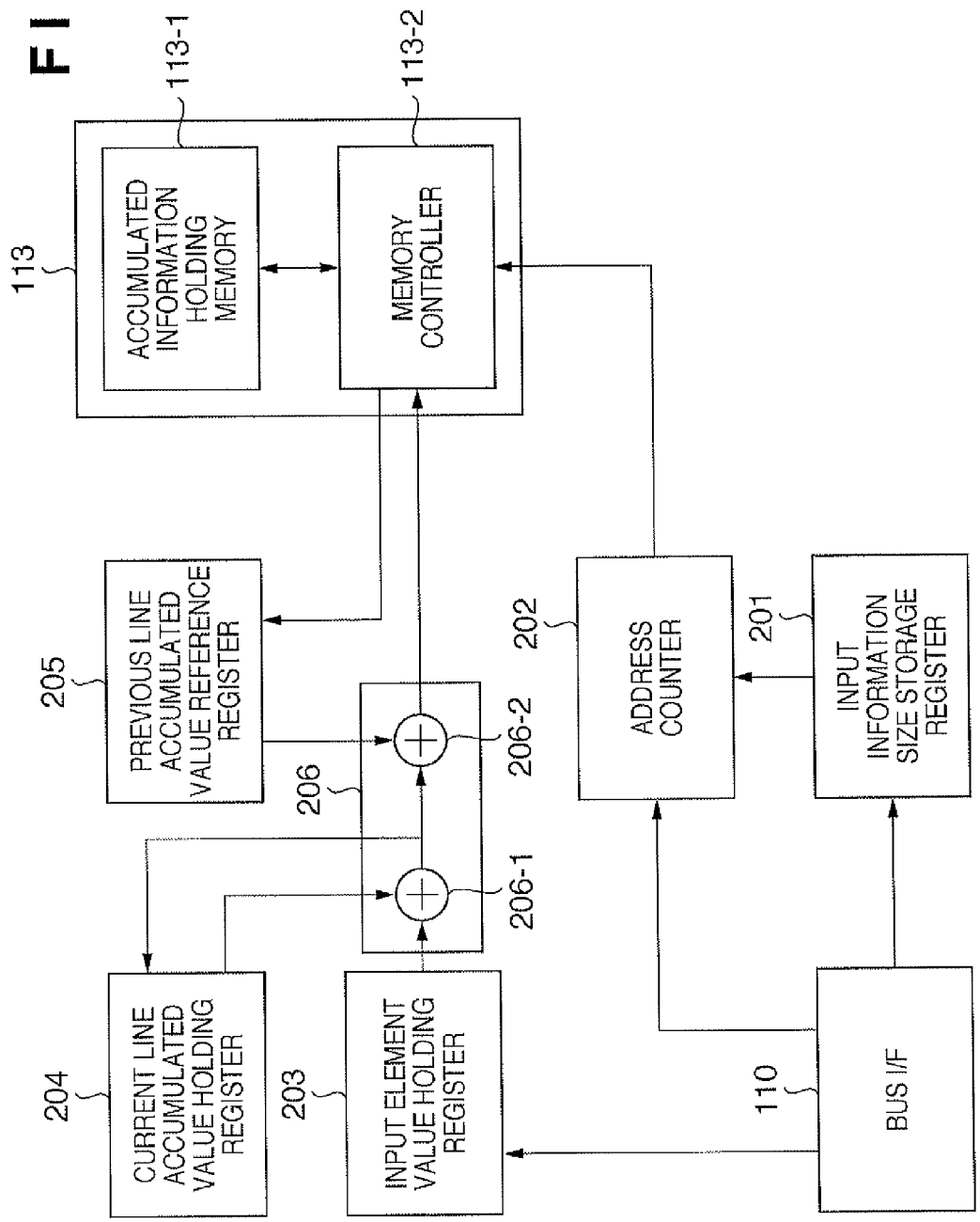
FIG. 2 is a block diagram showing the arrangement of an accumulated information generation unit.

The arrangement and operation of the accumulated information generation unit 111 will be described below. FIG. 2 is a block diagram showing the arrangement of the accumulated information generation unit 111, and the connection state of the bus I/F 110 and accumulated information holding unit 113.

An input information size storage register 201 stores the size of multi-dimensional array information input from the information input unit 102. In the register 201, the CPU 101 sets a value via the bus I/F 110 before the beginning of processing. An input element value holding register 203 temporarily holds, in turn, one element value of the input array information input via the bus I/F under the control of the CPU 101 or DMAC 103.

Every time an element value is input to the input element value holding register 203, an address counter 202 calculates a memory address of the accumulated information holding unit 113, which is to store an accumulated information value generated in correspondence with the element value, based on the size of the input array information stored in the input information size storage register 201. When the first pixel (origin point position) of the input information is input, the address counter 202 resets the storage address to zero or a predetermined offset value, and increments the storage address one by one until the last pixel of an image is input.

The address counter 202 refers to the size of the input array information stored in the input information size storage register 201, and calculates a previous line accumulated information address at which an accumulated information value at an identical column position in one line before when an element value that belongs to the second or subsequent line is input. The address counter 202 obtains this address by subtracting the number of elements in an element array for one line from the previously calculated storage address. When two-dimensional data is input as in this embodiment, if this subtraction result assumes a negative value (or it is smaller than the offset), it can be determined that the input processing of element values of the first line is still in progress.

The address calculated by the address counter 202 is supplied to a memory controller 113-2, thus attaining a write or read access to that address of an accumulated information holding memory 113-1.

The previous line accumulated value referred to based on the previous line accumulated information address is temporarily held in a previous line accumulated value reference register 205. However, when the current input pixel belongs to the first line, "0" is set in this register.

A current line accumulated value holding register 204 holds accumulated sum information from the first element (origin point) only for the currently input line. At the input timing of an element to the input element value holding register 203, the current line accumulated value holding register 204 holds the accumulated sum value of elements which have been input before the current element. Since this value is held for only one line which is being input, it is reset to "0" when an input line changes.

An accumulated addition processor 206 comprises two adders 206-1 and 206-2. Both the adders 206-1 and 206-2 input and output positive integers of the bit precision $N_{buf}$.

The generation operation of accumulated information is executed as follows. The CPU 101 sets the sizes in respective dimensional directions of array information to be input in the input information size storage register 201 via the bus I/F 110. The first element of the array information input from the information input unit 102 is input to the input element value holding register by the transfer function of the CPU 101 or DMAC 103. At the same time, the address counter is reset to "0" or a predetermined offset value. Also, at the same time, the previous line accumulated value reference register 205 is reset to "0" since elements of the first line are to be input, and the current line accumulated value holding register 204 is reset to "0" since the first element of one line is input.

The adder 206-1 of the accumulated addition processor 206 adds the current line accumulated value and the input element value. Since the sum is fed back to and stored in the current line accumulated value holding register 204, it can be used when the next element value is input. This sum value is also input to the adder 206-2, and is added to the previous line accumulated value held in the previous line accumulated value reference register 205. This sum is an accumulated information value corresponding to the input element position, and is stored at the storage address, which is calculated by the aforementioned address counter 202, of the accumulated information holding memory via the memory controller 113-2. After that, by repeating the same processing every time an array element value is input, in the processing for the second and subsequent lines, the input array element value is added to the current line accumulated value and the accumulated information value at the same position in the previous line, thereby generating accumulated information corresponding to the input information.

(Description of Accumulated Information Use Calculation Unit)

Figure 8:
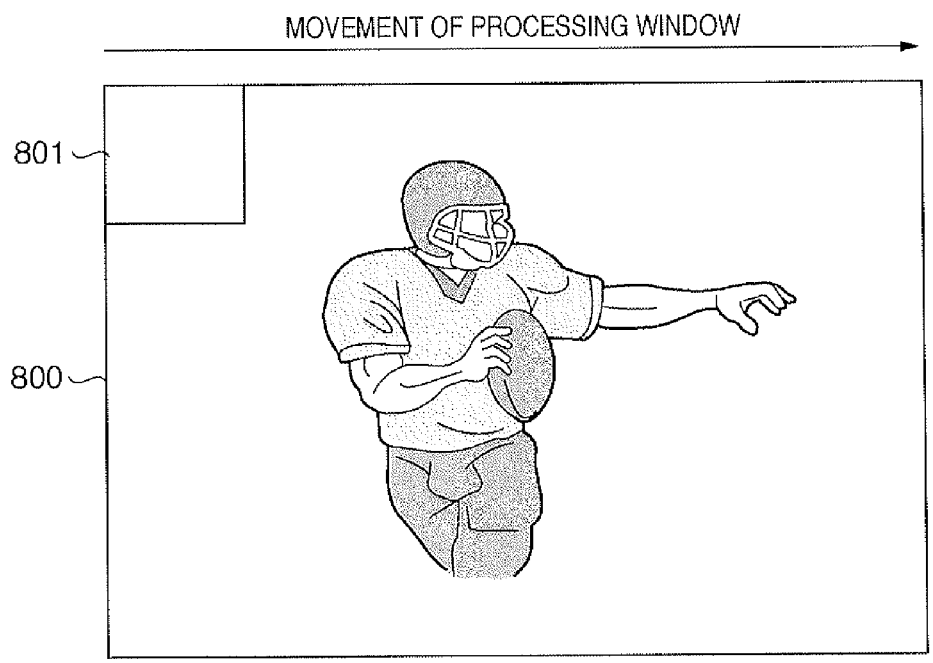
FIG. 8 is a view for explaining face detection processing as an example of pattern recognition processing.
Figure 9:
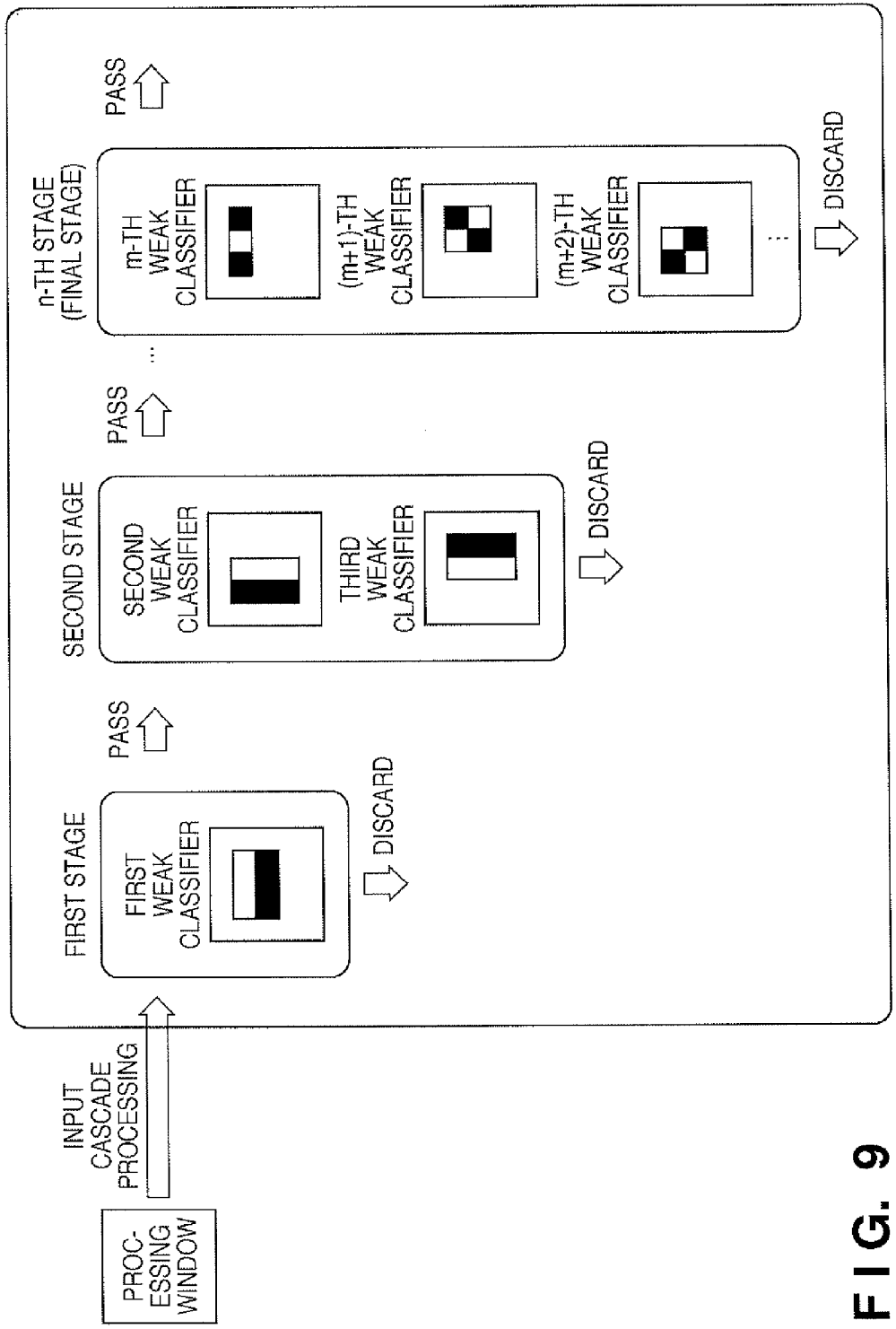
FIG. 9 is an exemplary view showing the arrangement of a pattern identifier comprising a plurality of weak classifiers.
Figure 10:
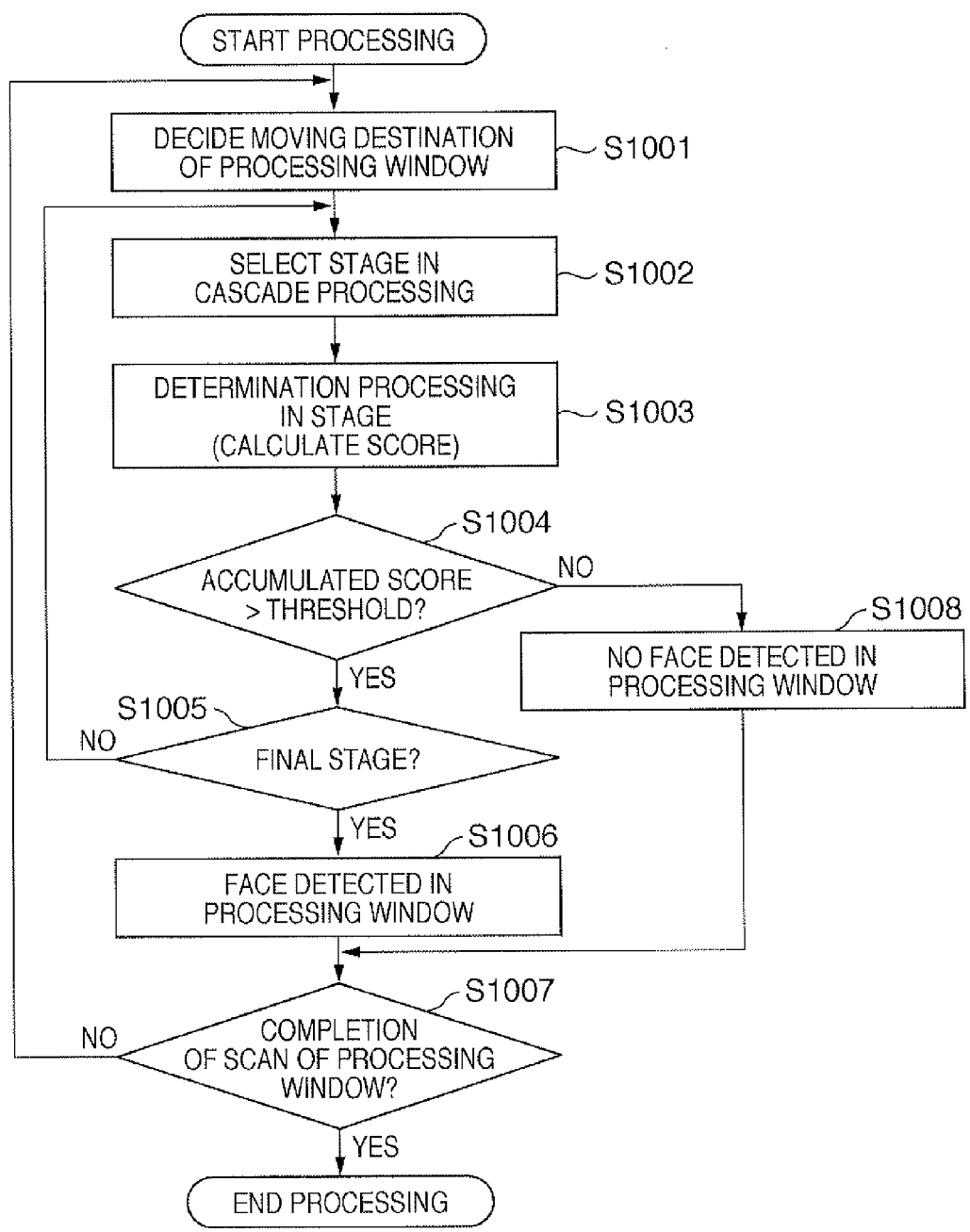
FIG. 10 is a flowchart of the detection processing in the pattern identifier comprising the plurality of weak classifiers.

The arrangement and operation of the accumulated information use calculation unit 112 used in the main processing in step S1103 will be described below. In this embodiment, the pattern identification processing described with reference to FIGS. 8 to 10 is executed as the subsequent processing that uses the calculation result using the accumulated information. Therefore, the required calculation result is the sum total value of elements in each rectangle of the weak classifiers which are relatively arranged in the processing window 801 and detect Haar-like features. The sum total value of elements in an arbitrary rectangular region of an input image can be calculated with reference to element values of four points of the accumulated image information, as has been described above with reference to FIG. 5.

Figure 3:
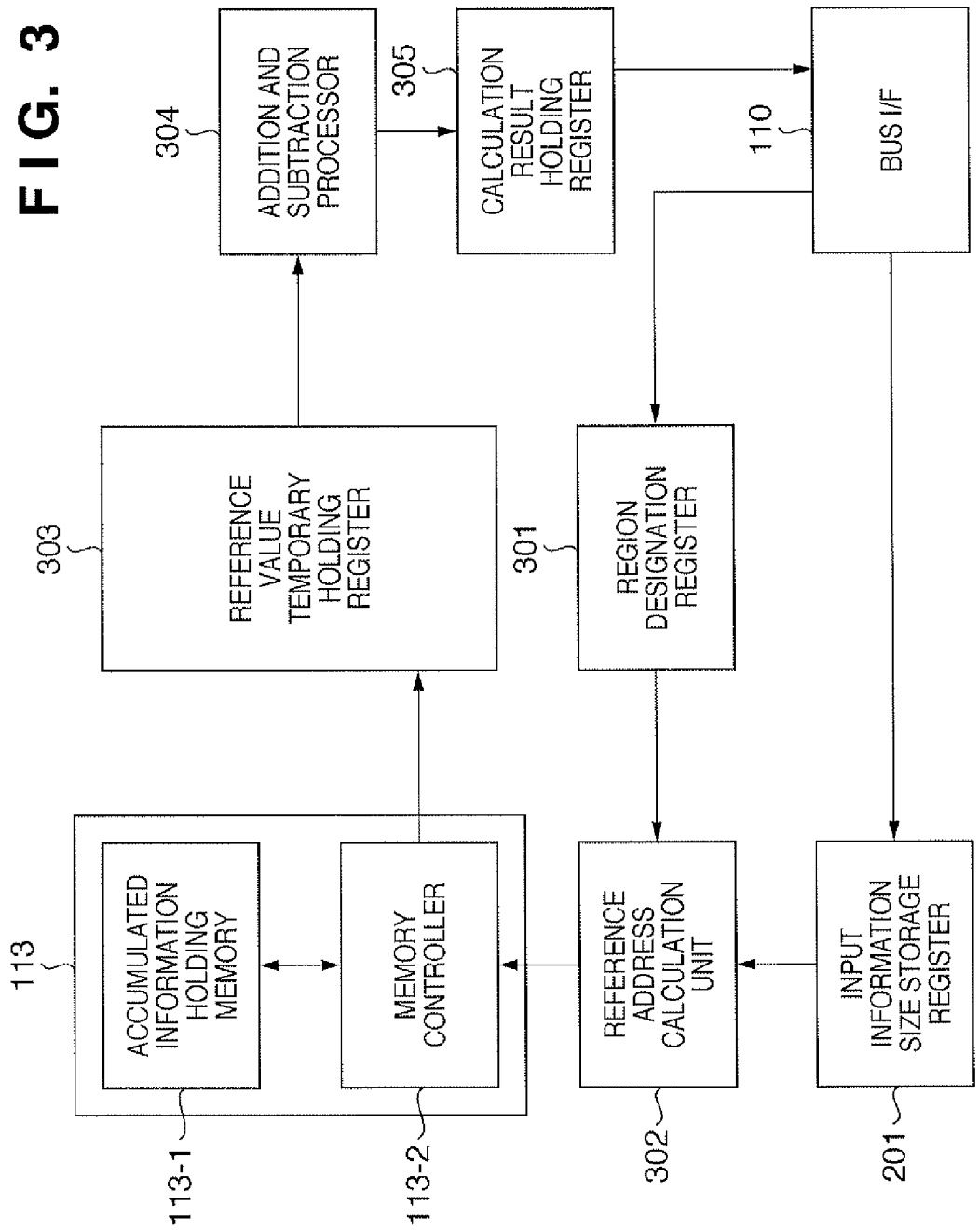
FIG. 3 is a block diagram showing the arrangement of an accumulated information use calculation unit.

FIG. 3 is a block diagram showing the arrangement of the accumulated information use calculation unit 112 and connections to the bus I/F 110 and accumulated information holding unit 113. Reference numeral 201 denotes an input information size storage register, which is the same as that described in FIG. 2. As described above, the CPU 101 sets, in advance, the size of input information in this input information size storage register 201 via the bus I/F 110.

The CPU 101 specifies a rectangular region in which the sum total value in the processing window is to be calculated. The CPU 101 converts the diagonal coordinates (relative coordinates) of two points in the processing window, which represent this rectangular region into absolute coordinates from the origin point of the input information, in other words, $(x_0, y_0)$ and $(x_1, y_1)$ in FIG. 5. The CPU 101 sets these absolute coordinate values in a region designation register 301 via the bus I/F 110.

Figure 5:
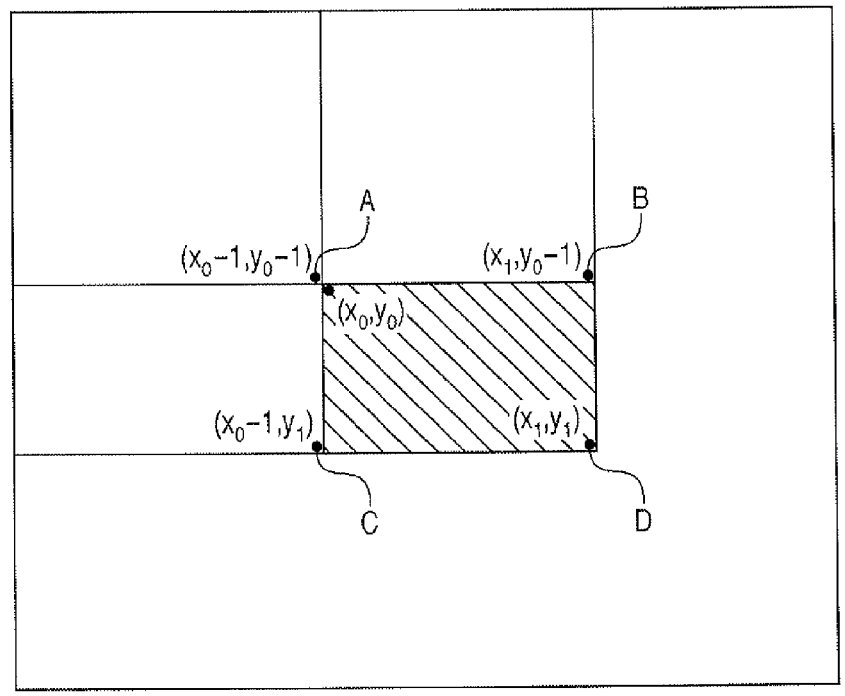
FIG. 5 is an explanatory view of a method of calculating the sum total value of pixels in a desired rectangular region using accumulated image information.

In response to a calculation start trigger from the CPU 101 via the bus I/F 110, a reference address calculation unit 302 refers to the values set in the region designation register 301, and calculates addresses where the values at the positions of four points A, B, C, and D in FIG. 5 are stored. The reference address calculation unit 302 passes the address values in turn to the memory controller 113-2.

The memory controller 113-2 accesses the accumulated information holding memory 113-1 and sets the sequentially acquired accumulated information values of the four points in a reference value temporary holding register 303.

After the reference value temporary holding register 303 holds the values of the four points, an addition and subtraction processor 304 executes predetermined addition and subtraction processing using the values of the four points. Note that the predetermined addition and subtraction processing makes calculations given by equation (2). This calculation result is held in a calculation result holding register 305. The CPU 101 can detect completion of the calculations by reception of an interrupt message via the bus I/F 110, reference to a completion flag, or the like. The CPU 101 acquires the value of the calculation result holding register 305, and uses it as the sum total value of the set rectangular region.

Note that all adders and subtractors used in the addition and subtraction processor 304 input and output $N_{buf}$-bit positive values.

(Bit Reduction Method Based on Description of Crow84)

The method, described in Crow84, of reducing the bit precision of the buffer by holding accumulated information generated after block division will be described in detail below. Since only the calculations specified in Crow84 do not suffice to recover the original, non-divided accumulated information value, as described above, a method that improves this point will be described below with reference to FIGS. 6A and 6B.

Figure 6A:
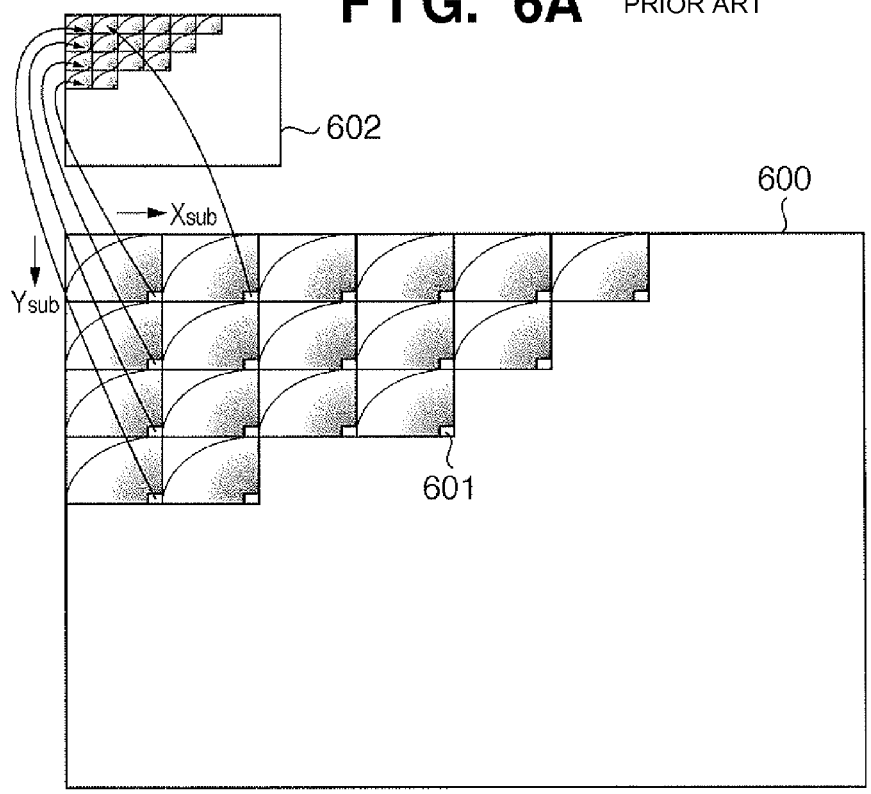
FIGS. 6A and 6B are explanatory views of the related art that reduces the bit precision of a buffer which holds accumulated information.
Figure 6B:
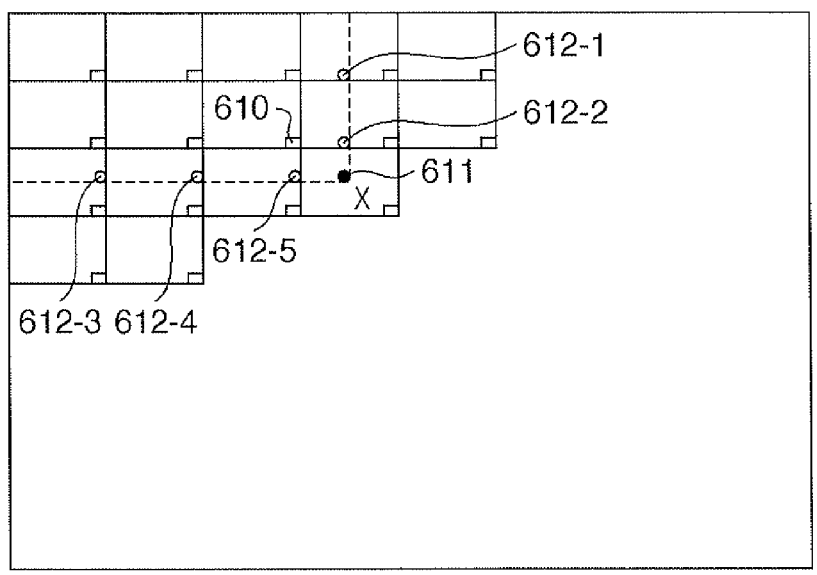

FIG. 6A is an exemplary view for explaining a holding method of accumulated information after block division. An image 600 indicates a state in which an input image having a size of $X_{img} \times Y_{img}$ pixels is divided into blocks each having $X_{sub} \times Y_{sub}$ pixels, and accumulated image information is generated to have a pixel at the upper left end as an origin point for each block. Let $C_{sub(j,k)}$ be the accumulated image information of each block, which will be referred to as sub accumulated information hereinafter, and $C_{sub(j,k)}(X_{sub}, Y_{sub})$ be the value (sub accumulated information value) at a position $(X_{sub}, Y_{sub})$ when a pixel at the upper left end is used as an origin point (0, 0) in each block. Note that j represents the horizontal block position, and k represents the vertical block position (both are integer values starting from "0"). Also, $0 \le x_{sub} < X_{sub}$, and $0 \le y_{sub} < Y_{sub}$. At this time, a worst value $C_{max\_sub}$ of each $C_{sub(j,k)}(X_{sub}, Y_{sub})$ is given by:

$$C_{max\_sub} = I_{max} X_{sub} Y_{sub} \quad (4)$$

A bit precision $N_{buf\_sub}$ that can store this worst value is the bit precision required for a buffer that is required to store $C_{sub(j,k)}$. ($I_{max}$ is a maximum value that can be assumed as an input information value of the bit precision $N_{img}$, in other words, $2^{N_{img}} - 1$.)

A buffer $R_{sub}$ 602 that stores accumulated information values $R_{sub}(j,k)$ (to be referred to as representative accumulated information values hereinafter) 601 calculated at the lower right end positions of respective blocks $C_{sub(j,k)}$ for the conventional overall region is independently prepared. That is, in association with equation (1), we have:

$$R_{sub}(j,k) = C(X_{sub}(j+1)-1, Y_{sub}(k+1)-1) \quad (5)$$

Since the bit precision of $R_{sub}(j, k)$ is $N_{buf\_max}$ due to the conventional accumulated information. If we have:

$$J_{max} = (X_{img} - 1)/X_{sub}, K_{max} = (Y_{img} - 1)/Y_{sub} \quad (6)$$

the number of elements of $R_{sub}$ is expressed by $(J_{max} + 1)(K_{max} + 1)$ since it is equal to the number of blocks ("/" in these equations indicates an integer division, and the remainder is truncated).

Assume that a set of sub accumulated information $C_{sub(j,k)}$ of all blocks and representative accumulated information $R_{sub}$ are stored. At this time, only addition of the value of a sub accumulated information value 611 to a representative accumulated information value at a position 610 falls short of recovering a conventional accumulated image information value $C(x, y)$ corresponding to the position of a point X shown in FIG. 6B, and sub accumulated information values at positions 612-1 to 612-5 need to be added. Therefore, assuming:

$$x_{sub} = \mathrm{mod}(x, X_{sub}), y_{sub} = \mathrm{mod}(y, Y_{sub})$$

$$j = x/X_{sub}, k = y/Y_{sub} \quad (7)$$

by making a calculation given by:

$$C(x, y) = R_{sub}(j-1, k-1) + C_{sub(j,k)}(x_{sub}, y_{sub}) + \sum_{0 \le k' < k} C_{sub(j,k')}(x_{sub}, Y_{sub} - 1) + \sum_{0 \le j' < j} C_{sub(j',k)}(X_{sub} - 1, y_{sub}) \quad (8)$$

the conventional accumulated information value at the desired position X can be reproduced. (Note that mod(a, b) is the remainder upon making an integer division a/b. When j=0 or k=0, we have $R_{sub}(j-1, k-1)=0$.)

After the values of the four points are calculated in this way, equation (2) is calculated as in normal accumulated image information, thus calculating the sum total value of the rectangular region.

When such accumulated information holding method is adopted, if $X_{sub} = Y_{sub} = 16$ for an input image having $N_{img} = 8$, $X_{img} = 640$, and $Y_{img} = 480$, since $C_{max\_sub} = I_{max} X_{sub} Y_{sub} = 65280 = $ FF00h, $N_{buf\_sub} = 16$ bits. Even when all pieces of generated accumulated information are temporarily held, the total buffer size to be assured is $N_{buf\_sub} \times X_{img} \times Y_{img} + N_{buf\_sub} \times J_{max} \times K_{max} = 4947600$ bits. That is, as can be seen from the above description, compared to a case in which all $C(x, y)$ values are held, the buffer size can be greatly reduced.

However, the buffer size reduction method based on block division suffers problems to be described below. That is, in the conventional method, by only referring to the values of the four points, the sum total value of a desired rectangular region can be calculated by making a simple addition and subtraction calculation given by equation (2). However, in this method, calculations of equations (7) and (8) need to be made for the four points to recover their values. That is, the calculation load required to obtain a desired result increases considerably.

Especially, implementation of dividers required to calculate equations (7) considerably increases the circuit scale upon hardware implementation of the processing. Since the adders and subtractors required to calculate equation (2) uses the conventional accumulated information value, an input of the same bit precision $N_{buf\_max}$ as in the conventional method is required, although the bit precision of the buffer is reduced. Since this bit precision is normally larger than that required to store the sum total value to be calculated of a partial region, it may be a factor of an increase in circuit scale.

Furthermore, when parallel calculation processing is executed to increase the processing speed, since these increased circuits effect with (degree of parallelism)-fold, a deeper problem is posed, and they influence the operation clocks and the number of pipeline stages. Even upon software implementation of the processing, since the processing load corresponding to recovery calculations increases, the execution speed drops considerably.

Therefore, in this embodiment, a method without block division (to be described below) is executed.

(Bit Precision and Generated Overflow Accumulated Information)

Figure 4:
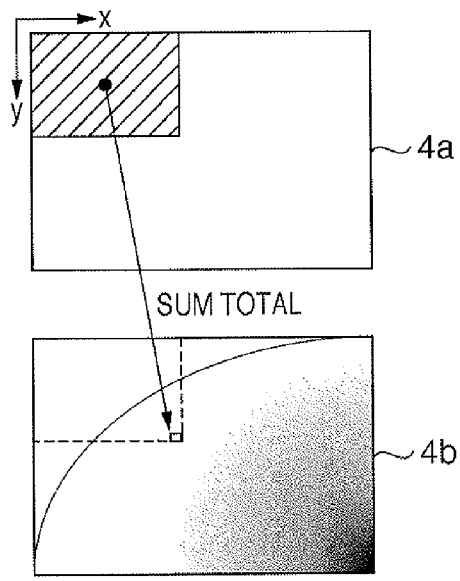
FIG. 4 is a view for explaining a conventional method of generating accumulated image information based on two-dimensional input information.
Figure 7:
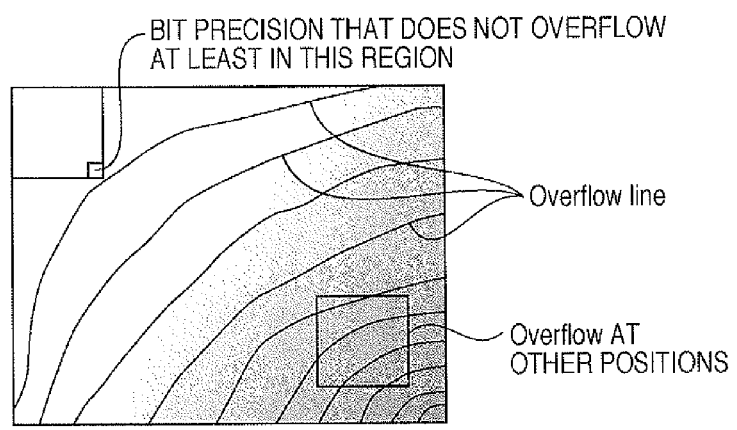
FIG. 7 is an exemplary view showing overflow accumulated information.

Assume that the bit precision $N_{buf}$ is the bit precision $N_{buf\_max}$ that can store worst accumulated value $C_{max}$ when all the input array elements assume a maximum value, as described above. At this time, the conventional accumulated information 4b shown in FIG. 4 is generated, and when the input information is a two-dimensional array, the value monotonically increases in the lower right direction. However, when a buffer used to hold accumulated information is set to have a bit precision (predetermined bits) which meets $N_{buf} < N_{buf\_max}$, the value overflows at a certain position in the lower right direction, and returns to a small value, as shown in FIG. 7. This process is repeated, and accumulated information corresponding to a part of the predetermined bits or less of original accumulated information is generated. Such accumulated information will be referred to as overflow accumulated information hereinafter.

Note that FIG. 7 illustrates overflow positions using contours. In general, since the accumulated value stores up toward the lower right position, the frequency of occurrence of overflow increases, and the contour interval is smaller. That is, even in an area of an identical size (e.g., in the processing window), the frequency of occurrence of overflow increases toward the lower right position.

The information processing apparatus of this embodiment uses the accumulated information generation unit 111 of the bit precision $N_{buf}$, which generates such overflow accumulated information, and the accumulated information holding unit 113. Since the adders and subtractors used in the addition and subtraction processor 304 input and output $N_{buf}$-bit positive values, as described above, an overflow or underflow may occur depending on the values of four points to be referred to.

The accumulated information holding unit 113 comprises the accumulated information holding memory 113-1 and memory controller 113-2, as described above. The accumulated information holding memory 113-1 can store an $N_{buf}$-bit value at each address, but by devising the memory controller 113-2, a versatile 8-bit or 32-bit RAM may be used. In this case, the memory controller 113-2 associates an address and bits with each other, and assigns fractional bits as a difference from $N_{buf}$ as another address value. Hence, a minimum required RAM size can be used by packing.

The reason why no problem is posed upon using the calculation result value in the subsequent processing even when the overflow accumulated information of the bit precision $N_{buf}$ shown in FIG. 7 and the addition and subtraction processing is executed using the $N_{buf}$-bit adders and subtractors, and a method of deciding a problem-free, minimum required bit precision will be described below.

(Principle of Overflow Accumulated Information and Decision Prerequisites of Bit Precision)

In this embodiment, overflow accumulated information is generated to have $N_{buf}=N_{ov}$ to be described below. FIG. 5 is a view for explaining the principle that allows to correctly calculate the sum total value of elements in a rectangular region even using the overflow accumulated information. Note that FIG. 5 corresponds to normal accumulated information, in other words, 4b in FIG. 4, in the description of the background art (equation (2)), but the following description will be given by replacing it by the overflow accumulated information, in other words, that corresponding to FIGS. 6A and 6B. The same purpose of use applies as far as the sum total of element values in a specific region in an original input image (4a in FIG. 4) is to be calculated.

In FIG. 5, let A, B, C, and D be element values (overflow accumulated values) at the positions of points $(x_0-1, y_0-1)$, $(x_1, y_0-1)$, $(x_0-1, y_1)$, and $(x_1, y_1)$. Assume that the bit precision of the dedicated buffer memory of the accumulated information holding unit is $N_{ov}$, and $X=2N_{ov}$. Note that a calculation mod(S', T') is defined as the remainder upon dividing S' by T', and is represented by S. Note that T is a positive integer, and S' is an integer which may have either a positive or negative sign. When S' is negative, a value obtained by adding T until that value becomes equal to or larger than 0 is defined as the calculation result S of mod(S', T'). Therefore, S is a nonnegative integer.

Assume that S' is a calculation result obtained by adding and/or subtracting a plurality of positive integers or by their combination. If the adders and subtractors which input and output $N_{ov}$-bit positive integers are used, the obtained output overflows if it exceeds X or underflows if it is smaller than 0. Hence, the result equals S=mod(S', X'). That is, if a true addition and subtraction calculation result S' is equal to or larger than X, S becomes the remainder upon division by X; if S' is a negative value, S becomes a value obtained by adding X to S' until it becomes a positive value. As a result, the value S which always satisfies $0 \le S < X$ is obtained.

If the buffer has the bit precision $N_{ov}$, the overflow accumulated values A, B, C, and D shown in FIG. 5 can be expressed by:

$$A = \mod(A', X)$$

$$B = \mod(B', X)$$

$$C = \mod(C', X)$$

$$D = \mod(D', X) \quad (9)$$

where A', B', C', and D' are values at identical positions in case of the normal, conventional accumulated information free from any overflow, are positive integers, and are respectively given, according to the description of equation (2), by:

$$A' = C(x_0-1, y_0-1)$$

$$B' = C(x_1, y_0-1)$$

$$C' = C(x_0-1, y_1)$$

$$D' = C(x_1, y_1) \quad (10)$$

In this embodiment, the accumulated addition processor 206 shown in FIG. 2 uses adders which input and output $N_{ov}$-bit positive integers in correspondence with the bit precision of the buffer. Therefore, upon generation of the overflow accumulated information, the need for calculations corresponding to equations (9) is obviated, and such calculations have consequently been made.

Letting $C(x_0, y_0; x_1, y_1) = S'$ be the sum total value in a rectangular region defined by $(x_0, y_0)$ and $(x_1, y_1)$ as diagonal points, from equations (2) and (10), the value to be calculated is:

$$S' = C(x_0-1, y_0-1) - C(x_0-1, y_1) - C(x_1, y_0-1) + C(x_1, y_1) = A' - B' - C' + D' \quad (11)$$

A', B', C', and D' are respectively expressed by:

$$A' = A''X + A$$

$$B' = B''X + B$$

$$C' = C''X + C$$

$$D' = D''X + D \quad (12)$$

At this time, A", B", C", and D" are quotients obtained by dividing A', B', C', and D' by X, respectively.

A case will be examined below wherein the same addition and subtraction processing as equation (11) is executed using A, B, C, and D intact in place of A', B', C', and D'. Assume that all adders and subtractors used input and output $N_{ov}$-bit positive integers. (That is, in this embodiment, the addition and subtraction processor 304 also comprises adders and subtractors which input and output $N_{ov}$-bit positive integers). At this time, the calculation result S overflows if (A−B−C+D) is larger than X due to bit limitations on the adders and subtractors, or S underflows if it is smaller than 0. Hence, $0 \le S < X$. That is, from the aforementioned definition of the mod calculation, we have:

$$S = \mod\{(A-C-B+D), X\} \quad (13)$$

Substitution of equations (12) to equation (13) and its modification yield:

$$S = \mod\{(A - C - B + D), X\} \quad (14)$$
$$= \mod[\{(A' - C' - B' + D') - (A'' - C'' - B'' + D'')X\}, X]$$
$$= \mod\{(A' - C' - B' + D'), X\}$$
$$= \mod(S', X)$$

That is, as can be seen from equation (14), if $0 \le S' < X$ is guaranteed, S=S'.

Since S' is the sum total value in a specific rectangular region of input information having element values of positive integers (or fixed-point numbers) based on its original definition, it is guaranteed that S'≥0. Therefore, when $N_{ov}$ that can guarantee $0 \leq S < X = 2N_{ov}$ is selected, and is used as the bit precision $N_{buf}$ of the buffer, S=S' can be guaranteed.

This indicates that $N_{ov}$ need only be determined according to the size of a specific rectangular region required in the subsequent processing. Letting $X_{rect\_max}$ and $Y_{rect\_max}$ be the sizes of a maximum rectangular region used in the subsequent processing, the worst value of the sum total value in the rectangle is given by:

$$C_{rect\_max} = I_{rect\_max} X_{rect\_max} Y_{rect\_max} \qquad (15)$$

Therefore, $N_{ov}$ need only be determined to be equal to or larger than the size required to store $C_{rect\_max}$ without overflow.

For example, the following examination will be made under the same condition exemplified in the description of background art in the BACKGROUND ART. That is, assume that an input image has $N_{img}=8$, $X_{img}=640$, and $Y_{img}=480$. Assume that sizes of the maximum rectangular region used in the subsequent processing are defined by, for example, $X_{rect\_max} = Y_{rect\_max} = 16$.

In this case, since $C_{rect\_max} = I_{rect\_max} X_{rect\_max} Y_{rect\_max} = 65280 = \text{FF00h}$ (the same value as $C_{max\_sub}$), $N_{ov}=16$ bits (the same value as $N_{buf\_sub}$ upon block division described above). Even when all pieces of accumulated information generated for the entire region of the input image are to be temporarily held, the buffer size to be assured is $N_{ov} \times X_{img} \times Y_{img} = 4915200$ bits. That is, under this condition, the buffer size can be further reduced compared to the aforementioned method of block division+holding of representative accumulated information values.

Of course, in the method of this embodiment, since the number of bits of $N_{ov}$ increases with increasing maximum rectangular region sizes to be used, the buffer size is not always reduced compared to the aforementioned method using block division depending on the conditions. However, as has been described so far, the arrangement is very simple since computing units to be used are only the adders and subtractors of the bit precision $N_{buf} = N_{ov}$.

As has already been described above, the aforementioned method using block division requires complicated additional calculations (circuits) such as dividers for recovery calculations, adder and subtractors, registers, and the like of the bit precision $N_{buf\_max} > N_{ov}$. By contrast, according to the method of this embodiment, the number of times of calculations is the same as that for the conventional, non-divided accumulated information, and the bit precision of computing units can be reduced. Since the number of stages of circuits is reduced, the circuits may be overclocked. That is, the method of this embodiment has large merits not only in a reduction of the buffer size but also an increase in processing speed and a reduction of the circuit scale.

The upper limit of $N_{ov}$ is arbitrary if the circuit scale and buffer size have enough margins. If $N_{ov} = N_{buf\_max}$, the conventional accumulated information free from overflow is generated. However, if $N_{ov} > N_{buf\_max}$, it is nonsense since the number of bits that are not used effectively merely increases. If $N_{ov} < N_{buf\_max}$, the aforementioned overflow accumulated information is likely to be generated according to the values of an input image. However, as described above, no problem is posed if overflow accumulated information is generated, as long as $N_{ov}$ is equal to or larger than a lower limit $N_{ov\_min}$, which is set based on the sizes of a specific rectangular region required in the subsequent processing.

Normally, it is most advantageous to set $N_{ov} = N_{ov\_min}$. When there is a possibility of making the same circuits to execute another processing in future, $N_{ov}$ is set to be as large as possible as long as the circuit scale and processing time permit, possibilities of coping with more processes increase.

(Bit Precision Decision Method: Rectangle Reference and Processing Window Reference)

Two examples of the method of deciding the lower limit $N_{ov\_min}$ of the bit precision $N_{ov}$ based on the principle of the present invention will be described below. Assume that the same pattern recognition processing as in Viola01 in the background art is executed as an example of the subsequent processing.

As the first method, in FIG. 9, each weak classifier obtained as a result of learning comprises a filter by combining a plurality of rectangular regions. By checking all these filters independently of their positive and negative (white and black) patterns, a filter of a region with the maximum size (including the largest number of elements) is selected. Then, $N_{ov\_min}$ is decided based on the maximum rectangular region. This method allows to decide most efficient $N_{ov\_min}$ upon execution of the pattern recognition processing. However, if re-learning is required due to a change in recognition condition or the like, filters generated after learning may use larger rectangular regions, and may not meet the condition.

By contrast, as the second method, a method of using the size, of the processing window 801 described using FIG. 8 as a maximum rectangular region, and similarly deciding $N_{ov\_min}$ is available. With this method, although the efficiency is more likely to be lower than the first method, the circuits that can cope with re-learning can be configured unless the processing window size changes.

Second Embodiment

The first embodiment has described the example in which the overflow accumulated information corresponding to the entire region of input information is held in the accumulated information holding unit 113. However, the present invention is not limited to such specific example.

Figure 12:
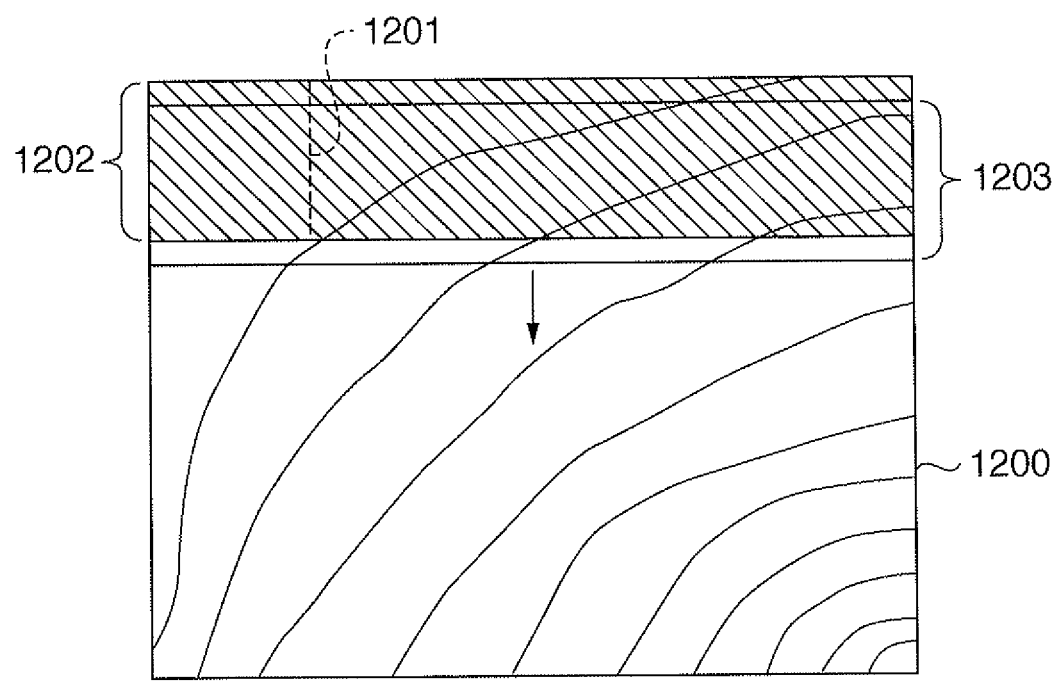
FIG. 12 is a view for explaining holding of accumulated information by a band buffer.

FIG. 12 shows a region of overflow accumulated information to be temporarily held when the accumulated information holding memory 113-1 of the accumulated information holding unit 113 is used as a band buffer. A region 1200 indicates the entire region of the overflow accumulated information described in FIG. 7. With respect to the entire region 1200 of the overflow accumulated information, a region 1202 indicates a band region which has a predetermined height and is used to temporarily hold accumulated information.

The height of the band region 1202 is set to be equal to that of a processing window 1201 of subsequent processing, and its width is equal to that of the input information. Note that subsequent processing in this embodiment is the same as that in the first embodiment, which has been explained as that after the main processing shown in FIGS. 10 and 11. However, processing corresponding to the main processing in step S1103 is executed for each band region. Upon completion of the band processing at one band position, overflow accumulated information to be held slides downward by one line, and the main processing is executed to have a region after sliding as a logically continuous region from a processing window at the left end at that band position.

The region 1202 indicates a band region to be held initially at the beginning of processing, and a region 1203 indicates a state in which a band region to be held has moved downward by one line. The band buffer of this embodiment is configured as a ring buffer for respective lines. Hence, upon generating a new line, the oldest line is discarded, and a new line is held in this area. Therefore, although conversion of a desired position of the overflow accumulated information to an address in the current buffer is required, there is nearly no processing overhead compared to a case in which information for the entire region is to be held.

Figure 13:
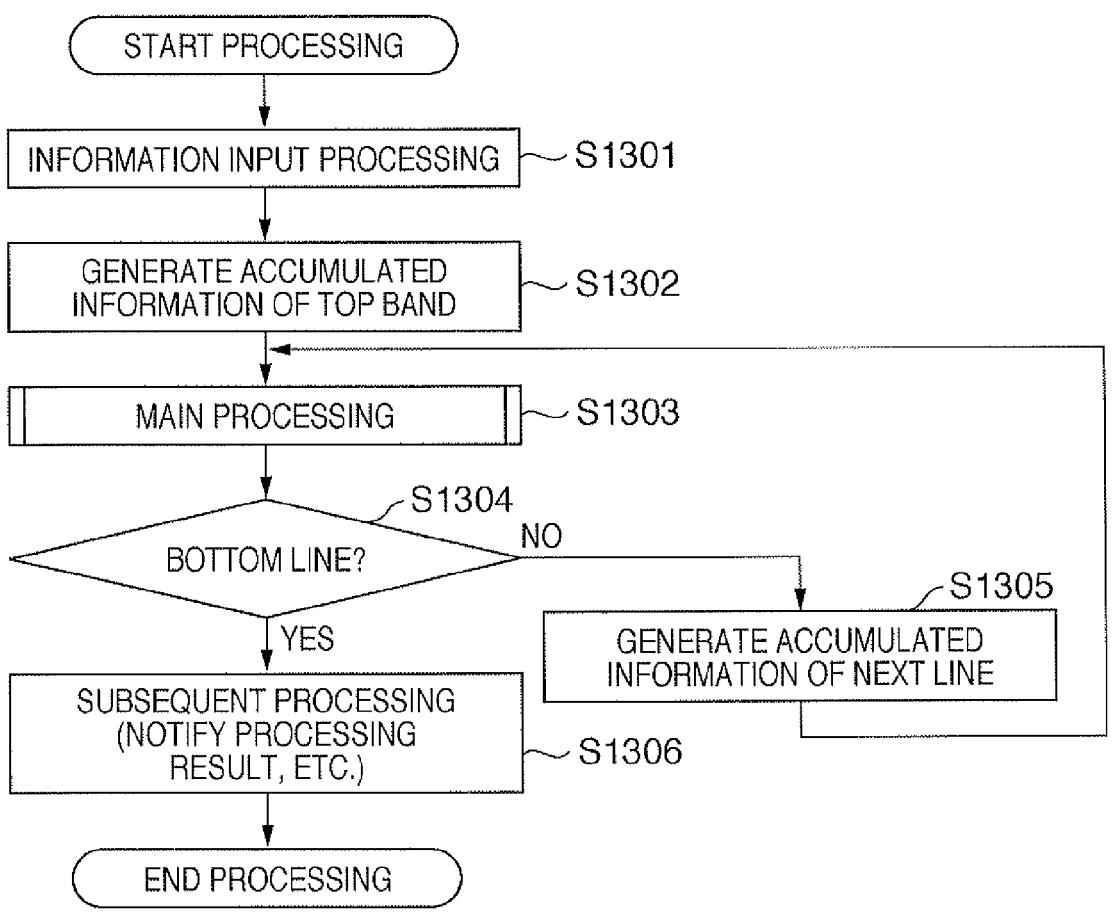
FIG. 13 is a flowchart showing the sequence of the overall processing when the band buffer holds accumulated information.

FIG. 13 is a flowchart showing the sequence of the overall processing when the band buffer holds overflow accumulated information, and corresponds to FIG. 11 in the first embodiment.

Step S1301 is the same information input processing as in step S1101. As in the first embodiment, step S1301 may be implemented to be executed parallel to steps S1302 and S1305 to be described later.

Step S1302 is accumulated information generation processing. Unlike in step S1102, this processing generates accumulated information only at a top band position in the band region 1202. Note that the operations of the CPU 101, DMAC 103, and accumulated information processor 100 are the same as those in the first embodiment, except for a range.

If the band buffer in the accumulated information holding unit 113 holds accumulated information at the position (origin point position) indicated by the region 1202 in step S1302, main processing is executed in step S1303, which corresponds to step S1103. In this embodiment as well, pattern recognition processing described using FIG. 10 is executed.

When the processing window 1201 is located at the top position of a band, as shown in FIG. 12, the predetermined processing which has been described as steps S1002 to S1008 in FIG. 10 is executed. Next, as the processing corresponding to step S1001, the processing window 1201 is moved from the top position to a position shifted to the right by one pixel, and the predetermined processing is executed again. After that, the predetermined processing is repeated as in the first embodiment until the processing window 1201 reaches the right end of the band region 1202. That is, in this embodiment, step S1001 is the processing for moving the processing window 1201 from the left end position of the band to the right pixel by pixel, and completion of scan in step S1007 is the processing for detecting completion of processing until the right end of one band.

Upon completion of the main processing in step S1303 for one band, it is determined in step S1304 if the current processing band is located at a position where the bottom line of the input information is included.

If the band is not located at the position where the bottom line is included, the process advances to step S1305 to generate and hold accumulated information for the next line. At this time, since the accumulated information for the previous line has already been held in the band buffer of the accumulated information holding memory 113-1, accumulated information for one line can be generated by the same generation method described in the first embodiment. That is, this calculation processing does not cause any overhead due to use of the band buffer.

After the accumulated information for the next line is generated and held, the band position of accumulated information moves to the region 1203, and the main processing in step S1303 is executed again. After that, the same processing is repeated while moving the band downward line by line until the bottom line is determined in step S1304.

If it is determined in step S1304 that the bottom line is reached, subsequent processing in step S1306, which is the same as that in step S1104, is executed, thus ending the processing.

According to this embodiment, the memory size of the accumulated information holding memory 113-1 can be greatly reduced without any calculation overhead unlike in the first embodiment. Even upon holding using the band buffer, it is obvious that the bit precision $N_{buf}$ can be $N_{ov}$ described in the first embodiment because the subsequent addition and subtraction calculation processing is equivalent processing. Of course, the number of times of overflow in the band buffer is not particularly limited.

A case will be examined below wherein $N_{img}=8$, $X_{img}=640$, and $Y_{img}=480$, and the processing window size is 16×16 pixels (i.e., $X_{rect\_max}=Y_{rect\_max}=16$) as in the first embodiment. Since the size required to be temporarily held is for one band, the minimum required buffer size to be assured is $N_{ov} \times X_{img} \times Y_{img} = 16 \times 480 \times 16 = 163840$ bits, and it can be greatly reduced compared to the first embodiment.

The band height can be defined based on the maximum size of a rectangular region to be used actually, and the buffer size may be further reduced. However, in this case, the subsequent processing needs to be modified to that for each filer type in place of the processing for each processing window. Also, an overhead due to the modification of the subsequent processing may be produced.

Third Embodiment

As a method of further reducing the buffer size, a block buffer may hold overflow accumulated information.

Figure 14:
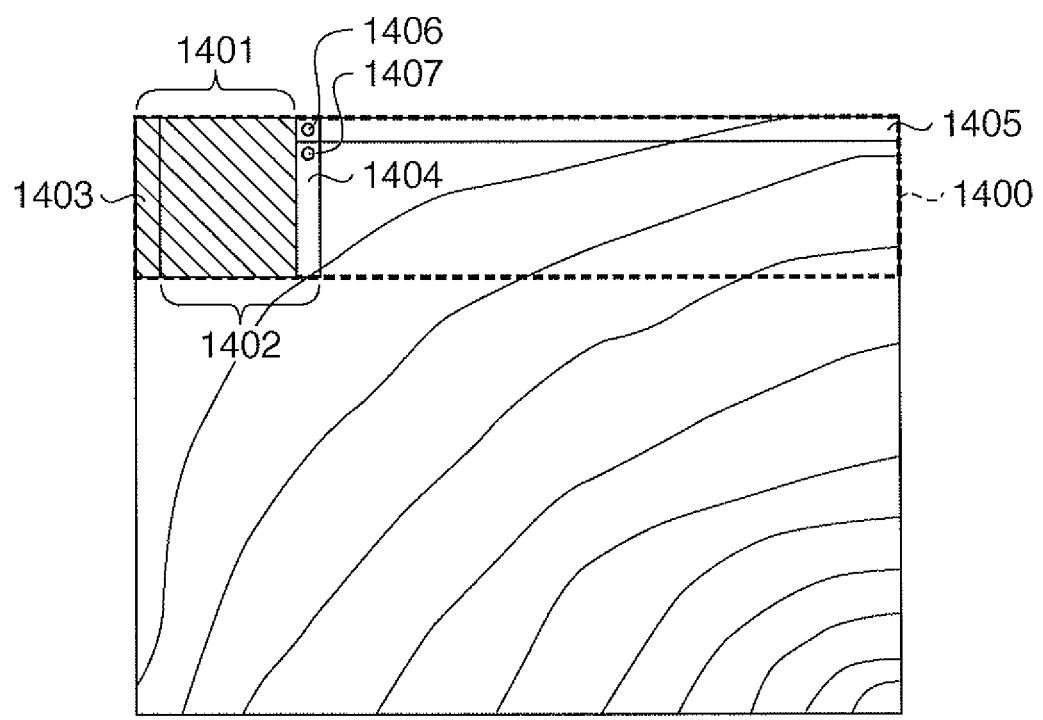
FIG. 14 is a view for explaining holding of accumulated information by a block buffer.

FIG. 14 shows a state of a block buffer used to temporarily store information with respect to the accumulated information for the entire region. Reference numeral 1400 denotes a broken line indicating the current processing band position. In FIG. 14, the broken line 1400 indicates the top band position. Reference numeral 1401 denotes a region of accumulated information currently held in the block buffer. In FIG. 14, the region 1401 is located at the start position (origin point position). The position of this region 1401 matches the current position of a processing window. Reference numeral 1402 denotes a region where the processing window moves to the right by one pixel. Upon processing this region, the block buffer holds accumulated information in that region.

In this embodiment, the block buffer comprises a ring buffer for respective vertical line segments. Note that the vertical line segment indicates a line segment, the length of which matches the processing window height. Upon moving the accumulated information held in the block buffer from the position of the region 1401 to that of the region 1402, accumulated information values stored in an area of a vertical line segment 1403 of the accumulated information to be held in the block buffer are discarded, and newly calculated accumulated information values for an area of a vertical line segment 1404 are held in that area. This processing is sequentially repeated until the right end position of the processing window.

Figure 16:
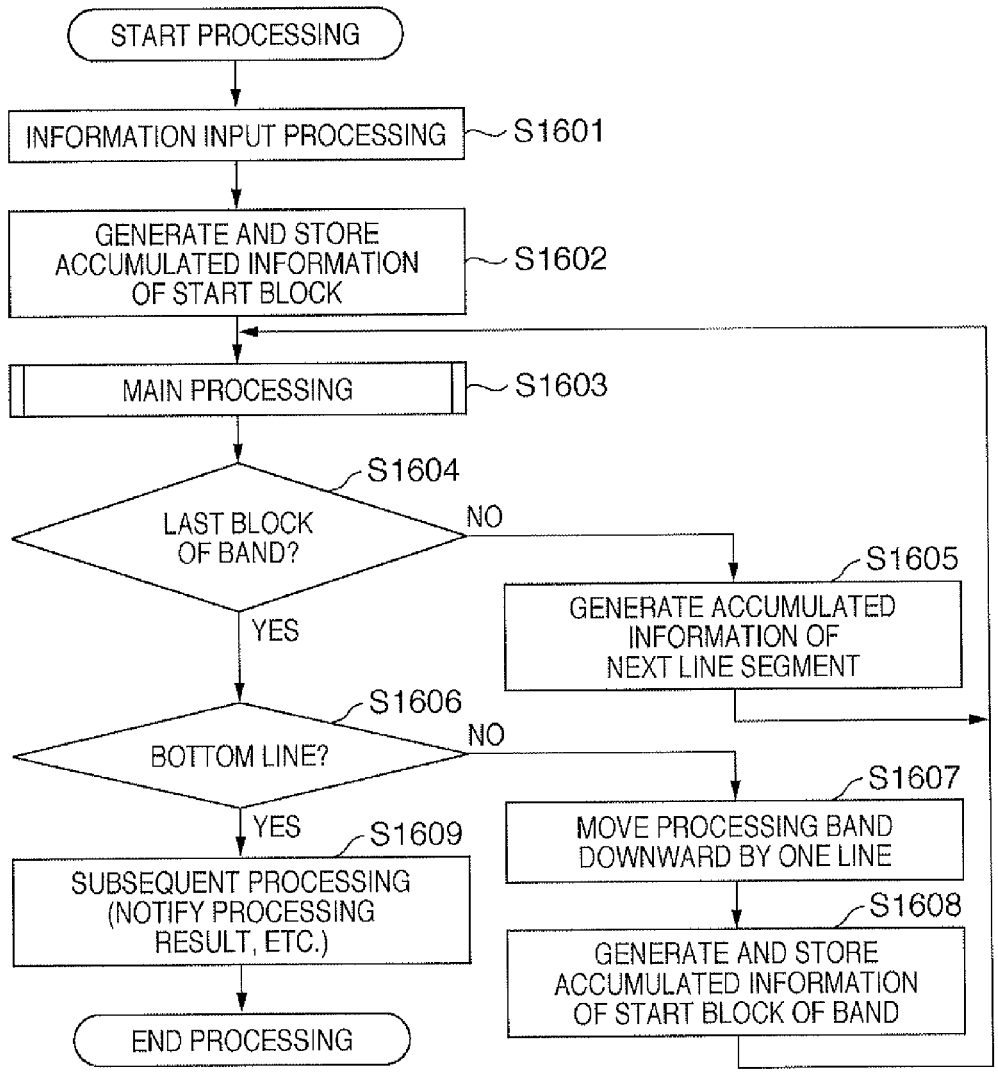
FIG. 16 is a flowchart showing the sequence of the overall processing when the block buffer holds accumulated information.

FIG. 16 is a flowchart showing the sequence of the overall processing when the block buffer holds overflow accumulated information.

Step S1601 is the same information input processing as in step S1101 in FIG. 11. Note that step S1601 may be executed simultaneously with steps S1602, 1605, and 1608 (to be described later) unless subsequent processing directly uses input information, as in the first embodiment.

Figure 17A:
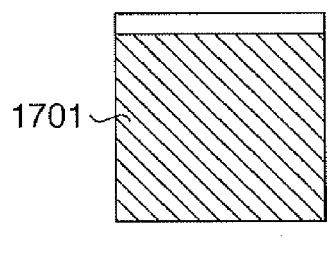
FIGS. 17A and 17B are explanatory views when the block buffer comprises double buffers.
Figure 17B:
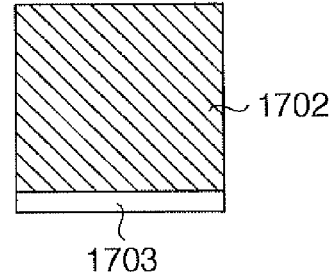

In step S1602, accumulated information of a start block at the top band position is generated and stored. That is, the accumulated information at the position of the region 1401 in FIG. 14 is generated. Note that the block buffer of this embodiment has a double-buffer structure in which two buffers each having the processing window size are prepared. FIGS. 17A and 17B show the two buffers. The generated accumulated information values for one block of the region 1401 are held in an area of FIG. 17A. At the same time, the same values as the accumulated information values in an area of a dotted part 1701 obtained by excluding a top line segment in FIG. 17A for one line are stored in an area indicated by a dotted part 1702 in FIG. 17B. The reason for this will be explained later.

In addition to the double buffers shown in FIGS. 17A and 17B, a storage area corresponding to a region 1405 in FIG. 14, in other words, that for top one line (except for the top block) in the current processing band needs to be prepared. This area will be referred to as a top column direction accumulated value buffer hereinafter. Upon completion of the processing in step S1602, all "0"s are set in the top column direction accumulated value buffer.

Next, main processing is executed in step S1603. This processing is nearly the same as that shown in FIG. 10. However, in this embodiment, since only processing for one processing window need only be executed, steps S1001 and S1007 are omitted.

Upon completion of the main processing for one processing window, in other words, one block, it is determined if the position of the processed block is that of a last block of the current processing band (indicated by the broken line 1400), in other words, the right end.

If the last block is not reached yet, accumulated information values for the line segment region 1404 which neighbors the right end of the block is generated, and are held in a buffer area which held the accumulated information values of the line segment region 1403. The accumulated information values corresponding to the position of this line segment 1404 can be calculated based on the input information of that region, the accumulated information values currently held in the block buffer, and the values held in the top column direction accumulated value buffer. That is, for each pixel in the line segment, a sum of values from the top pixel to the pixel of interest in the line segment is added to the value in the top column direction accumulated value buffer of the same column as the line segment, and the left neighboring accumulated information value of the pixel of interest already held in the block buffer is further added to the sum.

After a set of accumulated information corresponding to the line segment 1404 is stored in the block buffer, a sum of the top pixel value of the line segment 1404 to the value already stored at the same column position of the top column direction accumulated value buffer is re-stored. That is, the top column direction accumulated value buffer is a buffer which holds a vertical accumulated value for each column, which is obtained by accumulating values from a pixel of the start line to the upper end pixel of the line segment, the accumulated information of which is generated. By holding this value, an accumulated information value corresponding to each position can be calculated in synchronism with the downward movement of the processing band position. This is the same processing as in the overflow accumulated information of the first or second embodiment by adding an accumulated value in only the row direction to the accumulated information value in a line immediately above at the same column position. That is, since this embodiment uses the column direction accumulated value in place of the row direction accumulated value, the previous column accumulated information value can be used intact in place of the previous line accumulated information value. For example, in order to calculate a vertical line segment starting from a position 1407, the vertical accumulated value up to a position 1406 in the same column need only be added to the pixel value at that position and the left neighboring previous column accumulated information value. After that, the value of the top column direction accumulated value buffer is updated in accordance with the progress of the processing band for each line.

After the next line segment accumulated information is generated, and the processing window is moved to the right by one pixel, the process returns to step S1603 to execute the main processing for that region. The same processing is repeated until it is determined in step S1604 that the processing window reaches the right end block of the current processing band.

Upon completion of the processing up to the last block position (right end) at the processing band position, it is then determined in step S1606 if the processing is completed up to the bottom line position of the entire input information. If the processing band position does not reach the bottom line position yet, the processing band position is re-set at a position one line below in step S1607.

In step S1608, the generation and storage processing of accumulated information of a first block at the left end of the newly set processing band position is executed. This processing uses a block buffer different from one of the double buffers used at the previous processing band position. If the block buffer in FIG. 17A was used in the previous processing band, that in FIG. 17B is used in the current processing band. At this time, the area 1702 already stores the same value as the accumulated information corresponding to the area 1701 when the buffer in FIG. 17A was located at the top of the previous processing band position. (Of course, since the buffer in FIG. 17A has been used as a ring buffer, the current value is different.) Therefore, when new accumulated information of a horizontal line segment at a position 1703 is generated and is stored in the buffer in FIG. 17B, generation of the accumulated information of the first block at the current processing band position is completed. Note that the same value of the generated accumulated information is copied from the buffer in FIG. 17B to that in FIG. 17A to have the same positional relationship by shifting one line segment upward as in that from the buffer in FIG. 17A to that in FIG. 17B, so as to prepare for the processing of the next line.

Upon completion of generation of the accumulated information of the block at the first (left end) position in the current processing band, the process returns to step S1603 to execute the main processing for each block. After that, the processing is sequentially repeated for the entire region of the input information until the bottom line is reached in step S1606. In step S1609, the same subsequent processing as in step S1104 is executed, thus ending the overall processing.

In this embodiment as well, the bit precision $N_{buf}$ of the buffer can be $N_{ov}$ described in the first embodiment. Of course, an overflow occurs a plurality of times in a block according to the input information and the position of a block to be held. However, this calculation result using the overflow accumulated information can be used without posing any problem as in the first embodiment.

Upon calculating the buffer size in this embodiment under the same condition as in the examples described in the first and second embodiment, $N_{ov} \times \{X_{rect\_max} \times Y_{rect\_max} \times 2 + (X_{img} - X_{rect\_max})\} = 16 \times \{16 \times 16 \times 2 + (640 - 16)\} = 18176$ bits. Hence, the very small buffer size can be attained. In the above formula, ×2 is for the double buffers, and $(X_{img} - X_{rect\_max})$ is for the top accumulated value buffer.

Figure 15A:
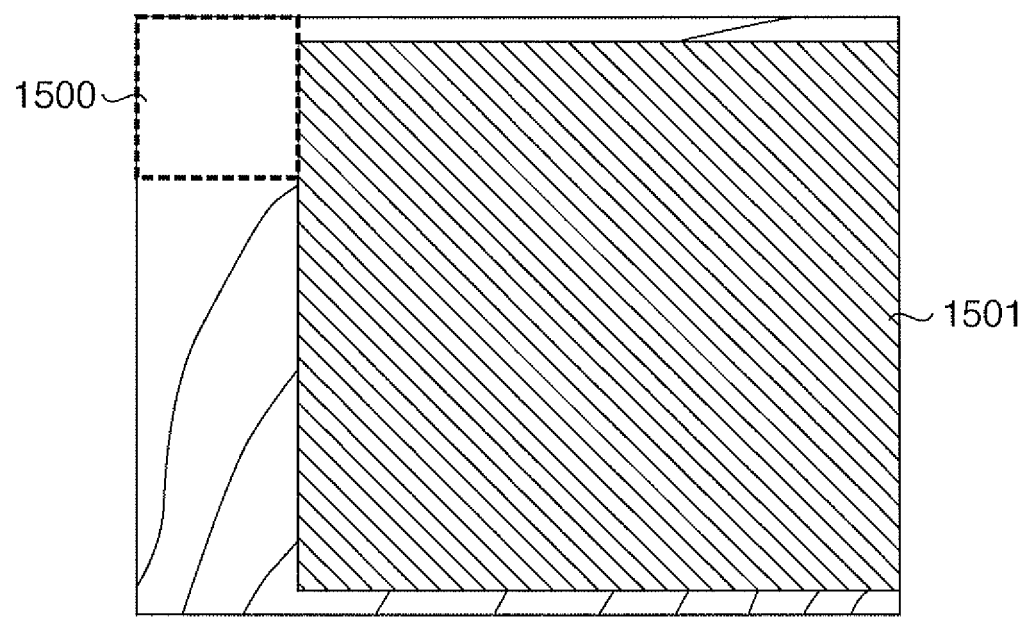
FIGS. 15A and 15B are views showing regions where a calculation overhead occurs when the block buffer holds accumulated information.
Figure 15B:
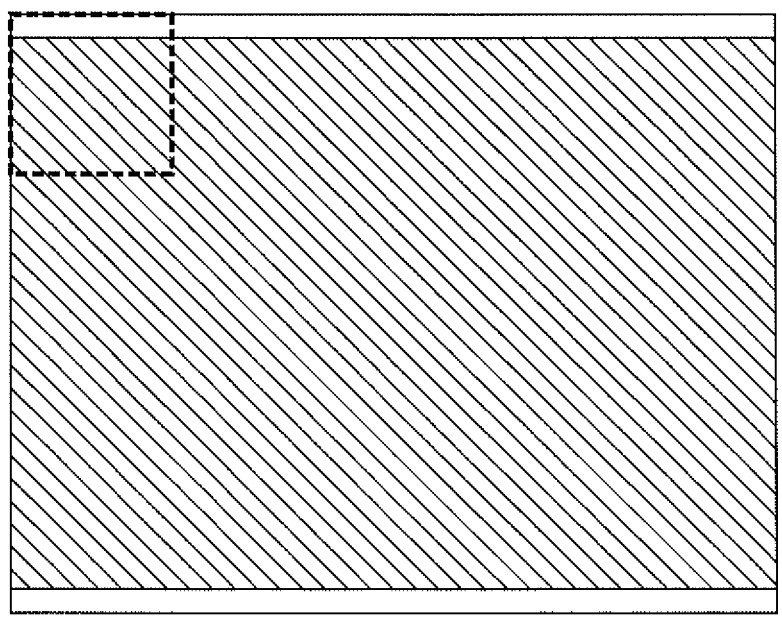

In the implementation using the block buffer of this embodiment, an overhead upon calculation of accumulated information is produced. A calculation overhead will be explained below with reference to FIGS. 15A and 15B. In FIG. 15A, accumulated information values in a region 1501 obtained by excluding a start processing window 1500 and top and bottom lines are calculated twice or more. For example, an accumulated information value at the position 1407 in FIG. 14 is calculated once when the processing band is located at the position indicated by the broken line 1400, and is calculated once again when the processing line is moved to the next position one line below. Hence, the same value is calculated twice at the position 1407. An accumulated information value of one pixel below is calculated three times, and that of two pixels below is calculated four times. Hence, when the block size is 16×16, an accumulated information value calculated a maximum of 15 times exists. In FIG. 15A, the reason why accumulated information values are not re-calculated in a region having the width of the window 1500 to the bottom line is the use of the double-buffer structure described using FIGS. 17A and 17B.

A configuration method using a single block buffer without adopting the double-buffer structure is also available. In this case, every time the processing band is moved downward by one line, all accumulated information values of a start block region are re-calculated. The position of a reference element of the input information need not be the origin point position unlike in the accumulated information described so far, and may be an element at the upper left end position of the processing band. That is, overflow accumulated information to be generated assumes a value different from that described using FIG. 7. Furthermore, every time re-calculations are made according to the movement of the band, a different accumulated value is stored even at an identical position. In this case, although some values are re-calculated a maximum of 15 times in case of the block size of 16×16 in the same manner as in the above method, a region in which re-calculations are made is that shown in FIG. 15B. The required buffer size is $N_{ov} \times X_{rect\_max} \times Y_{rect\_max} = 16 \times 16 \times 16 = 4096$ bits. Although the load required to calculate accumulated information becomes heavier, the required buffer size can be minimized. Note that the addition and subtraction load in the accumulated information use calculation unit 112 remains the same as in the embodiments described so far since the bit precision $N_{buf} = N_{ov}$.

Other Embodiments

Figure 18B:
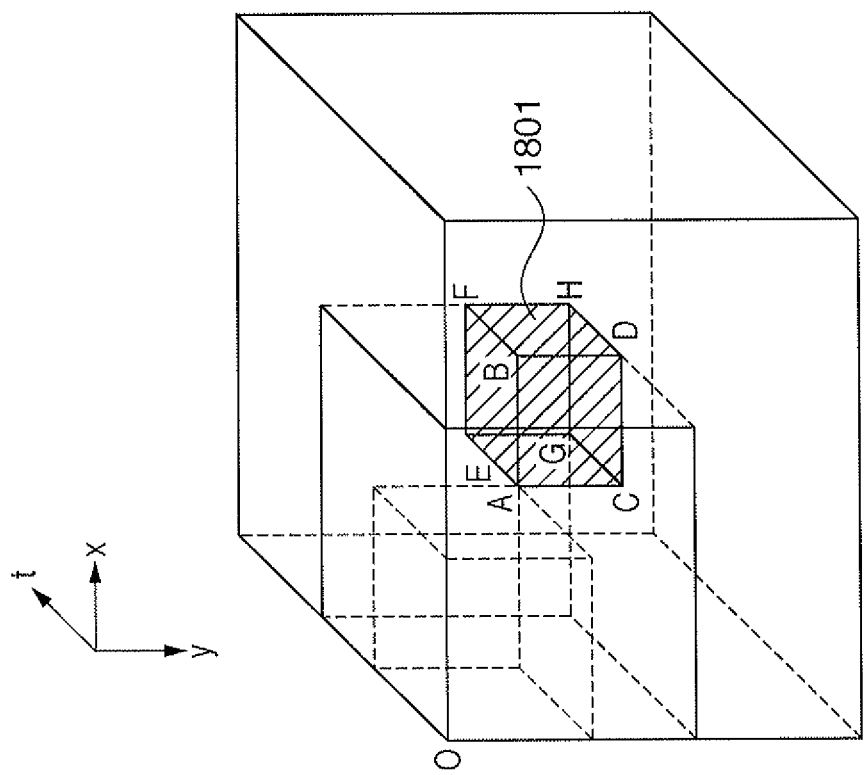
FIGS. 18A and 18B are explanatory views of three-dimensional accumulated information as an example of multi-dimensional accumulated information.
Figure 18A:
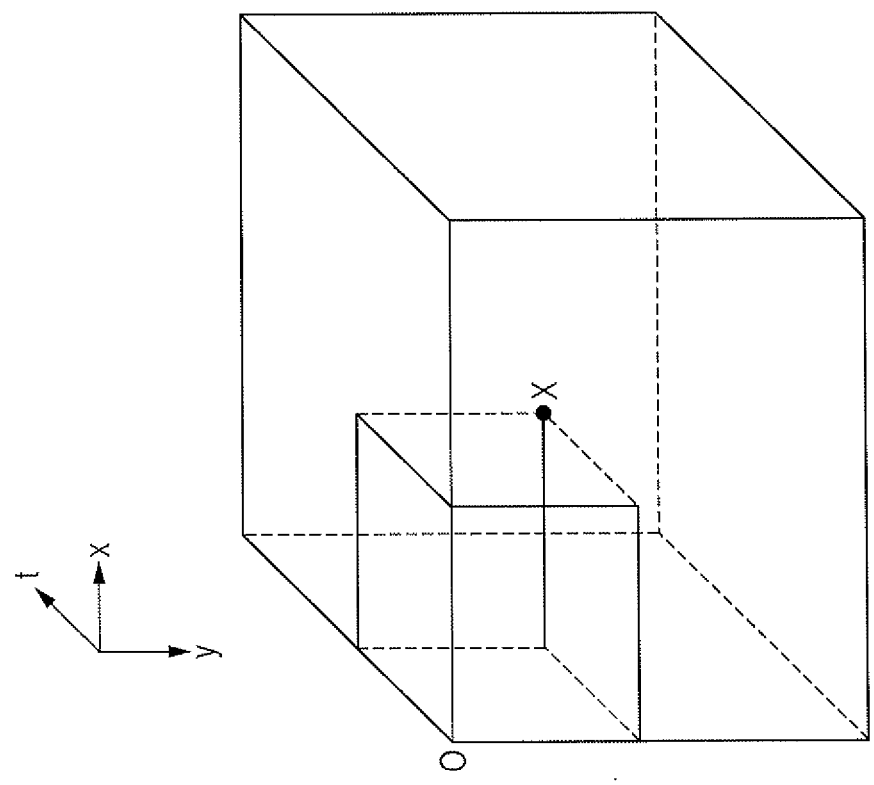

The aforementioned accumulated information can also be generated for multi-dimensional array information of three or more dimensions. FIGS. 18A and 18B are exemplary views showing a state of accumulated information for three-dimensional input information. The input information of a three-dimensional array is, for example, movie information, and three-dimensional information is defined by adding one dimension for the time axis to a two-dimensional image.

In FIG. 18A, an element at a position of a point X in a three-dimensional accumulated information array assumes the sum total value of elements included in a rectangular parallelepiped defined by an origin point and the point X in input three-dimensional information as diagonal points.

Using this three-dimensional accumulated information, the sum total value of elements in a rectangular parallelepiped 1801 shown in, for example, FIG. 18B can be calculated. Let $(x_0, y_0, t_0)$ and $(x_1, y_1, t_1)$ be the coordinates of the two points as the diagonal points of the rectangular parallelepiped 1801. Assuming that A, B, C, D, E, F, G, and H are accumulated information values at positions:

$A: (x_0-1, y_0-1, t_0-1)$ $B: (x_1, y_0-1, t_0-1)$ $C: (x_0-1, y_1, t_0-1)$ $D: (x_1, y_1, t_0-1)$ $E: (x_0-1, y_0-1, t_1)$ $F: (x_1, Y_0-1, t_1)$ $G: (x_0-1, y_1, t_1)$ $H: (x_1, y_1, t_1)$ \hfill (16)

a sum total value $S_{3d}$ of elements in the rectangular parallelepiped 1801 of the input information can be calculated by:

$S_{3d} = H - D - F + B - (G - C - E + A)$ \hfill (17)

Figure 19:
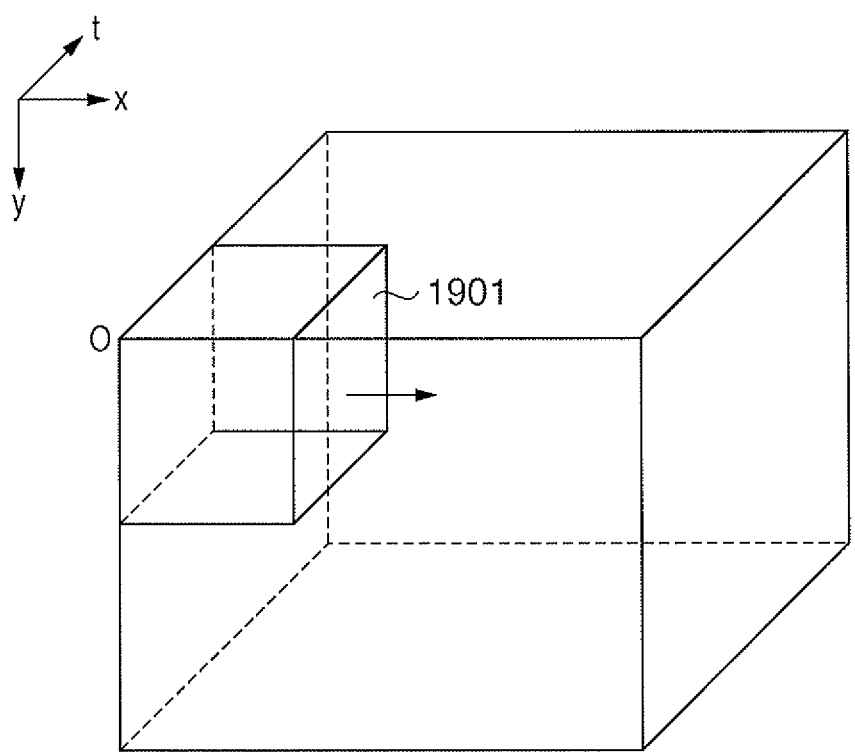
FIG. 19 is a view for explaining a processing window upon using the three-dimensional accumulated information.

The idea of the present invention may be applied to this three-dimensional accumulated information to be substituted by overflow accumulated information. In FIG. 19, reference numeral 1901 denotes an example of a processing window in case of three-dimensional input information. When this processing window size is $(X_{rect\_max}, Y_{rect\_max}, T_{rect\_max})$ a bit precision $N_{ov}$ that can store a sum total value when all elements in this window assumes a maximum value without overflow is calculated as in two-dimensional information. Then, the calculated bit precision $N_{ov}$ can be set as a bit precision $N_{buf}$ of a buffer. For example, assume that input information is 8 bits, and $X_{rect\_max} = 16$, $Y_{rect\_max} = 16$, and $T_{rect\_max} = 4$. At this time, $C_{rect\_max} = I_{max} X_{rect\_max} Y_{rect\_max} T_{rect\_max} = 255 \times 16 \times 16 \times 4 = 261120 = 3FC00h$, and $N_{ov} = 18$ bits. Of course, in case of this bit precision $N_{buf} = N_{ov}$, accumulated information is calculated while an overflow occurs in the processing window, as the window position is separated farther away from the origin point position. As in two-dimensional information, the sum total value in a desired rectangular parallelepiped can be calculated using equation (14).

Upon holding accumulated information using a band or block type buffer, as shown in FIGS. 20A, 20B, and 20C, the buffer size can be further reduced as in the case of two-dimensional information. If a buffer of a type shown in FIG. 20A of FIGS. 20A, 20B, and 20C is used, no extra overhead is produced upon calculation of accumulated information. In case of buffers of types shown in FIGS. 20B and 20C, the buffer size can be further reduced, but a large number of accumulated information values to be re-calculated are required as in the case of two-dimensional information.

As can be seen from the above description, the present invention can be similarly applied to accumulated information for multi-dimensional input information that exceeds three dimensions if a hyper rectangular parallelepiped is used.

The present invention can be applied not only to hardware circuits but also to software processing. For example, the aforementioned conventional accumulated information that requires a 27-bit precision must use a 32-bit long type array, while when the bit precision can be reduced to 16 bits, as described in the embodiments, a 16-bit short type array can be used. That is, the buffer size to be used can be reduced to half.

Furthermore, even when an aliquant bit precision is required, the memory use efficiency can be improved using, for example, a bit field function of C language or the like by trading off the memory access time.

The above embodiments have exemplified that the band buffer or block buffer is used as a ring buffer. However, the present invention is not limited to such specific memory use method. For example, a method of preparing a memory address table corresponding to a ring counter, and executing processing while assigning discontinuous areas for respective predetermined processes with reference to the table may be used. That is, the ring buffer described in the present invention is not limited to a narrowly-defined ring buffer or cyclic buffer.

The subsequent processing described as the main processing in each of the aforementioned embodiments is not limited to the pattern recognition processing. The present invention can be applied to processing of other fields such as computer graphics and the like described in the background art as long as the processing uses accumulated information and the size of a maximum region which is likely to be used can be limited.

Note that the present invention includes a case in which the functions of the aforementioned embodiments are implemented by processing of a CPU based on an instruction of a program code read out from a computer-readable storage medium.

As the storage medium used to supply the program code, for example, a Floppy® disk, hard disk, optical disk, magneto-optical disk, CD, DVD, magnetic tape, nonvolatile memory card, ROM, and the like can be used.

Furthermore, the present invention includes a case in which the functions of the aforementioned embodiments are implemented when a CPU or CPUs equipped in one or both of an image input apparatus and information storage apparatus or an apparatus that integrates or connects these apparatuses execute or executes some or all of actual processes.

As the image input apparatus, various cameras and scanners using a CCD such as a video camera, digital camera, monitor camera, and the like, and an image input apparatus which inputs a digital image converted by A/D-conversion from an analog image input apparatus can be used. As the information storage apparatus, an external hard disk, video recorder, and the like can be used.

According to the present invention, the processing load and buffer size required to calculate the sum total value of elements in a specific region of input information of a multi-dimensional array can be reduced. In case of hardware implementation of the apparatus according to the present invention, high-speed processing can be realized using a small circuit scale.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-145448, filed on May 31, 2007, which is hereby incorporated by reference herein in its entirety.

The invention claimed is:

1. An information processing method comprising the steps of:
   inputting an input information of a multi-dimensional array, having a plurality of positioned elements;
   calculating an accumulated information value corresponding to a position of each element of the input information; and
   holding the accumulated information value in a buffer having a plurality of storage areas, each of which can store a value of a predetermined bit length;
   calculating a total information value of a specified area by adding and subtracting accumulated information values, held in the buffer, corresponding to positions of the plurality of positioned elements which define the specified area; and
   determining whether the specified area includes a predetermined object based on the total information value of the specified area,
   wherein when an accumulated information value calculated in the calculating step overflows the predetermined bit length, least significant bits having the predetermined bit length in the calculated accumulated information value are held in a storage area of the buffer as the accumulated information value in the holding step, without holding an overflowed bit portion of the calculated accumulated information value, and in the step of calculating the total information value of the specified area, the total information value of the specified area is calculated by adding and subtracting the least significant bits in the calculated accumulated information values corresponding to positions which define the specified area.

2. The method according to claim 1, wherein the predetermined bit length is smaller than a size required to store an accumulated information value corresponding to a last element position of the input information without overflow when all elements of the input information of the multi-dimensional array assume a maximum value.

3. The method according to claim 1, further comprising the step of making an addition and/or subtraction among a plurality of accumulated information values held in the holding step,
   wherein in the addition/subtraction step, when a calculation result of the addition and/or subtraction overflows or underflows the predetermined bit length, a part of the predetermined bit length of the calculation result is output as a result of the addition and/or subtraction.

4. The method according to claim 3, wherein the result of the addition and/or subtraction output in the addition/subtraction step represents information associated with a specific region of the input information indicated by positions of elements of the plurality of accumulated information values.

5. The method according to claim 4, wherein the information associated with the specific region is a sum total of all elements in the specific region of the input information or information based on the sum total value.

6. The method according to claim 4, further comprising the step of executing subsequent processing using results of the addition and/or subtraction of a plurality of specific regions to have a region including the plurality of specific regions as a unit,
   wherein the predetermined bit length is a size required to store a sum total value when all elements of the input information assume a maximum value for the size of the predetermined bit length without overflow in the region as the unit of the subsequent processing.

7. The method according to claim 4, wherein the predetermined bit length is not less than a size required to store a sum total value when all elements of the input information assume a maximum value for the predetermined bit length in a region having the largest number of elements of the plurality of specific regions.

8. The method according to claim 4, wherein the input information is a two-dimensional array, and the specific region is a rectangular region indicated by positions corresponding to the plurality of accumulated information values in the two-dimensional array.

9. The method according to claim 4, wherein the input information is a multi-dimensional array of not less than three dimensions, and the specific region is a region of a hyper rectangular parallelepiped, which is indicated by positions corresponding to the plurality of accumulated information values in the input information as the multi-dimensional array of not less than the three dimensions.

10. The method according to claim 1, wherein the input information is a two-dimensional array, and in the calculating step, a sum total value of all elements in a rectangular region defined by an origin point position of the input information and a position of each element as diagonal positions is calculated as the accumulated information value corresponding to that element position.

11. The method according to claim 1, wherein the input information is a multi-dimensional array of not less than three dimensions, and in the calculating step, a sum total value of all elements in a region of a hyper rectangular parallelepiped defined by an origin point position of the input information and a position of each element as diagonal positions is calculated as the accumulated information value corresponding to that element position.

12. An information processing apparatus comprising:
at least one processor functioning as:
an input unit configured to input an input information of a multi-dimensional array having a plurality of positioned elements;
a calculation unit configured to calculate an accumulated information value corresponding to a position of each element of the input information; and
a holding unit configured to hold the accumulated information value in a buffer having a plurality of storage areas, each of which can store a value of a predetermined bit length;
a second calculation unit configured to calculate a total information value of a specified area by adding and subtracting accumulated information values, held in the buffer, corresponding to positions of the plurality of positioned elements which define the specified area; and
a determination unit configured to determine whether the specified area includes a predetermined object based on the total information value of the specified area,
wherein when an accumulated information value calculated by said calculation unit overflows the predetermined bit length, said holding unit holds least significant bits having the predetermined bit length in the calculated accumulated information value in a storage area of the buffer as the accumulated information value in the holding step, without holding an overflowed bit portion of the calculated accumulated information value, and in the step of calculating the total information value of the specified area, the total information value of the specified area is calculated by adding and subtracting the least significant bits in the calculated accumulated information values corresponding to positions which define the specified area.

13. The apparatus according to claim 12, further comprising:
an addition/subtraction unit adapted to make an addition and/or subtraction among a plurality of accumulated information values in association with a specific region of the input information; and
a subsequent processing unit adapted to execute subsequent processing using results of the addition and/or subtraction of a plurality of specific regions to have a region including the plurality of specific regions as a unit.

14. The apparatus according to claim 13, wherein said holding unit has a structure of logically the same number of dimensions as the input information, of respective dimensional directions, at least a one-dimensional direction is configured by the number of elements based on the number of elements in a certain direction of one dimension of the input information, and other dimensional directions are configured by the numbers of elements based on the numbers of elements in respective dimensional directions of the region as the unit of the subsequent processing.

15. The apparatus according to claim 14, wherein said calculation unit sequentially calculates, as the accumulated information value, an element array in which elements are arranged in a dimensional direction having the number of elements based on the number of elements in an identical dimensional direction of the input information,
when said calculation unit calculates a new element array of the accumulated information, said holding unit stores a calculation result of the new element array in an area in which an oldest calculated element array of the stored accumulated information was stored, and
said subsequent processing unit executes the subsequent processing under a condition that the element array newly stored in said holding unit is logically contiguous with remaining element arrays stored for some time.

16. The apparatus according to claim 13, wherein said holding unit has a structure of logically the same number of dimensions as the input information, and respective dimensional directions are configured by the numbers of elements based on the numbers of elements in respective dimensional directions of the region as the unit of the subsequent processing.

17. The apparatus according to claim 16, wherein said calculation unit calculates the accumulated information of a region including an element at a position corresponding to an origin point of all dimensions of the input information first, and then newly calculates the accumulated information of each of regions added by shifting only one element in a predetermined one-dimensional direction in the structure until a last position in the predetermined one-dimensional direction is reached,
said holding unit stores the newly calculated accumulated information in an area in which accumulated information, falling outside the shifted region, of the held accumulated information was held, and
said subsequent processing unit executes the subsequent processing under a condition that the accumulated information newly stored in said holding unit is logically contiguous with remaining accumulated information stored for some time.

18. The apparatus according to claim 17, wherein after the shift region has reached the last position in the predetermined one-dimensional direction, the region is temporarily returned to the origin point position in the predetermined one-dimensional direction, and the one-element shift processing in the predetermined one-dimensional direction and the calculation processing of the accumulated information by said calculation means, the holding processing by said holding unit, and the subsequent processing by said subsequent processing unit are similarly repeated to have a position obtained by shifting by one element in another one-dimensional direction as a new start position, and
by similarly repeating the one-element shift processing, the calculation processing, the holding processing, and the subsequent processing in other dimensional directions of the input information, an entire region of the input information undergoes the processing.

19. A non-transitory computer-readable storage medium storing a program, which when executed, performs the method of claim 1.

* * * * *